United States Patent
Kitamura

(10) Patent No.: US 8,653,902 B2
(45) Date of Patent: Feb. 18, 2014

(54) TRANSMISSION CIRCUIT, COMMUNICATION APPARATUS, AND TRANSMISSION METHOD

(75) Inventor: Ryo Kitamura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 144 days.

(21) Appl. No.: 13/383,486

(22) PCT Filed: May 12, 2011

(86) PCT No.: PCT/JP2011/002649
§ 371 (c)(1),
(2), (4) Date: Jan. 11, 2012

(87) PCT Pub. No.: WO2011/148582
PCT Pub. Date: Dec. 1, 2011

(65) Prior Publication Data
US 2012/0119841 A1 May 17, 2012

(30) Foreign Application Priority Data
May 27, 2010 (JP) ................................. 2010-121664

(51) Int. Cl.
*H04L 27/00* (2006.01)
(52) U.S. Cl.
USPC ........... 332/103; 332/149; 455/126; 455/108; 330/127; 330/136
(58) Field of Classification Search
USPC .................. 455/126, 127, 102, 108; 332/149; 339/127; 330/127, 136
See application file for complete search history.

(56) References Cited

U.S. PATENT DOCUMENTS

| 6,084,468 | A | 7/2000 | Sigmon et al. | |
|---|---|---|---|---|
| 6,256,482 | B1 * | 7/2001 | Raab | 455/108 |
| 7,570,931 | B2 * | 8/2009 | McCallister et al. | 455/126 |
| 8,489,037 | B2 * | 7/2013 | Fudaba et al. | 455/102 |
| 2009/0160548 | A1 | 6/2009 | Ishikawa et al. | |
| 2009/0191923 | A1 | 7/2009 | Fudaba et al. | |

FOREIGN PATENT DOCUMENTS

| CN | 101465621 A | 6/2009 |
|---|---|---|
| JP | 04-119707 A | 4/1992 |
| JP | 4216462 B2 | 11/2008 |
| JP | 2009-152904 A | 7/2009 |
| JP | 2009-177640 A | 8/2009 |
| WO | 2008/099464 A1 | 8/2008 |

OTHER PUBLICATIONS

International Search Report for PCT/JP2011/002649 dated Jul. 26, 2011.

* cited by examiner

*Primary Examiner* — Arnold Kinkead
(74) *Attorney, Agent, or Firm* — Pearne & Gordon LLP

(57) ABSTRACT

Provided is a transmission circuit that operates highly efficiently by avoiding deterioration of the linearity of an output signal and suppressing occurrence of distortion of the output signal, when using the envelope tracking method. In this transmission circuit, offset control section (160) sets voltage that makes the corrected envelope signal level equal to or higher than the delayed envelope signal level, as offset voltage. By this means, the corrected envelope signal level becomes equal to or higher than the delayed envelope signal level, so that it is possible to prevent the power supply voltage from being lower than the optimal power supply voltage, making it possible to prevent the linearity of an output signal from deteriorating in power amplifier (130).

14 Claims, 15 Drawing Sheets

| $\Delta V(t)$ | $\Delta V_{OFST}(t)$ |
|---|---|
| $< V_{th1}$ | $V_{STEP1}$ |
| $V_{th1} \leqq \Delta V(t) \leqq V_{th2}$ | 0 |
| $> V_{th2}$ | $V_{STEP2}$ |

FIG.6

| $\Delta V(t)$ | $\Delta V_{OFST}(t)$ |
|---|---|
| $<V'_{th1}$ | $V'_{STEP1}$ |
| $V'_{th1} \leqq \Delta V(t) \leqq V'_{th2}$ | 0 |
| $>V'_{th2}$ | $V'_{STEP2}$ |

FIG. 12

TRANSMISSION CIRCUIT, COMMUNICATION APPARATUS, AND TRANSMISSION METHOD

TECHNICAL FIELD

The present invention relates to high efficiency of a transmission circuit used for communication apparatuses including mobile phones or wireless LANs.

BACKGROUND ART

In the recent years of the advanced information society, communication apparatuses including mobile phones or wireless local area networks (LANs) that ensure the linearity of a transmission signal in a wide range of amplification of power, and operate with low power consumption, at the same time, are desired. For conventional communication apparatuses, a transmission circuit that outputs an accurate transmission signal and operates efficiently in all bandwidth, is used. However, for example, in a transmission circuit that generates a transmission signal using the modulation scheme including quadrature modulation (hereinafter referred to as "quadrature modulation circuit"), the linearity of a transmission signal and the efficiency of a transmission circuit have a relationship of trade off, and it is difficult to achieve the linearity of a transmission signal and the efficiency of a transmission circuit at the same time.

As a conventional transmission circuit that operates accurately and highly efficiently, for example, Patent Literature 1 discloses a transmission circuit using the envelope tracking method. FIG. 1 is a block diagram showing a configuration of conventional transmission circuit 10 disclosed in Patent Literature 1.

A transmission signal is input to power amplifier 15 via a quadrature modulator including delay circuit 16, digital to analog converter (DAC) 17, and up-converter 18. Further, envelope extraction section 11 extracts and outputs an envelope of the input transmission signal, as an envelope signal. The envelope signal receives bandwidth limitation in bandwidth limitation process section 12, and then is supplied to variable power supply section 14 via DAC 13. Variable power supply section 14 inputs the voltage based on the supplied signal to power amplifier 15. Power amplifier 15 amplifies the signal input from up-converter 18 to obtain an output signal.

Here, bandwidth limitation process section 12 limits the band so that the input envelope signal and the peak value of the output signal match. By making the envelope signal match the peak value of the output signal, it is possible to prevent power supply voltage (drain voltage or collector voltage) supplied to the power amplifier from variable power supply section 14 from lowering due to bandwidth limitation, avoiding deterioration of the linearity. Transmission circuit 10 lowers the required response speed of variable power supply section 14 using the envelope tracking method, without causing deterioration of the linearity of the amplifier.

CITATION LIST

Patent Literature

PTL 1
Japanese Patent Application Laid-Open No. 2009-177640

SUMMARY OF INVENTION

Technical Problem

However, in conventional transmission circuit 10, because a band is limited based on the peak value in bandwidth limitation process section 12, there is a problem that even in the case where the envelope signal level lowers, when there is no peak value of the output signal, the level of an output signal exceeds the optimal voltage level significantly, lowering the efficiency of power amplifier 15.

Further, in conventional transmission circuit 10, because a band is limited based on the peak value of an envelope signal in bandwidth limitation process section 12, the amount of bandwidth limitation depends on the shape of the envelope signal. Because the frequency bandwidth (response speed) of variable power supply section 14 needs to be decided based on the frequency band of an output signal of bandwidth limitation process section 12, there is a problem that flexibility in designing variable power supply section 14 is low.

In view of the above, it is therefore an object of the present invention to provide a transmission circuit, a communication apparatus, and a transmission method that operate efficiently by avoiding deterioration of the linearity of an output signal and suppressing occurrence of distortion of the output signal, when using the envelope tracking method.

Solution to Problem

A transmission circuit according to the present invention includes: a quadrature modulator that generates a vector modulation wave by quadrature-modulating an I signal, the I signal being an in-phase component of a modulation signal, and a Q signal, the Q signal being a quadrature-phase component of the modulation signal; a power amplifier that generates a transmission signal by amplifying the vector modulation wave according to power supply voltage; a low pass filter that generates a band limited envelope signal by performing band limitation on an envelope signal, the envelope signal being envelope information of the modulation signal; a delay section that outputs a delayed envelope signal by delaying the envelope signal for a time that is equivalent to an amount of delay of the low pass filter; an offset control section that sets offset voltage based on the bandwidth limited envelope signal and the delayed envelope signal; an addition section that corrects the bandwidth limited envelope signal by adding the offset voltage to the bandwidth limited envelope signal, to generate a corrected envelope signal; and a power supply voltage control section that supplies voltage corresponding to the corrected envelope signal, as the power supply voltage, to the power amplifier; wherein the offset control section sets voltage that makes a level of the corrected envelope signal equal to or higher than a level of the delayed envelope signal, as the offset voltage.

A communication apparatus according to the present invention includes the above-described transmission circuit.

A transmission method according to the present invention is a transmission method in a transmission circuit that includes a quadrature modulator that generates a vector modulation wave by quadrature-modulating an I signal, the I signal being an in-phase component of a modulation signal, and a Q signal, the Q signal being a quadrature-phase component of the modulation signal, and a power amplifier that generates a transmission signal by amplifying the vector modulation wave according to power supply voltage, the transmission method including the steps of: generating a band limited envelope signal by performing band limitation on an envelope signal, the envelope signal being envelope information of the modulation signal; outputting a delayed envelope signal by delaying the envelope signal for a time that is equivalent to an amount of delay of the low pass filter; setting offset voltage based on the bandwidth limited envelope signal and the delayed envelope signal; correcting the bandwidth limited envelope signal by adding the offset voltage to the bandwidth limited envelope signal, to generate a corrected envelope signal; supplying voltage corresponding to the corrected envelope signal, as the power supply voltage, to the power amplifier; and setting voltage that makes a level of the corrected envelope signal equal to or higher than a level of the delayed envelope signal, as the offset voltage.

Advantageous Effects of Invention

According to the present invention, a transmission circuit can operate efficiently by avoiding deterioration of the linearity of an output signal and suppressing occurrence of distortion of the output signal, when using the envelope tracking method. Further, it is not necessary to set the frequency bandwidth (response speed) of a power supply voltage control section based on the frequency band of an output signal of a low pass filter, so that it is possible to improve the flexibility in designing a power supply voltage control section.

BRIEF DESCRIPTION OF DRAWINGS

FIG. 6 shows an example of a look up table;

FIG. 12 shows an example of a look up table;

DESCRIPTION OF EMBODIMENTS

Now, embodiments of the present invention will be described in detail with reference to the accompanying drawings.

Embodiment 1

Figure 1:
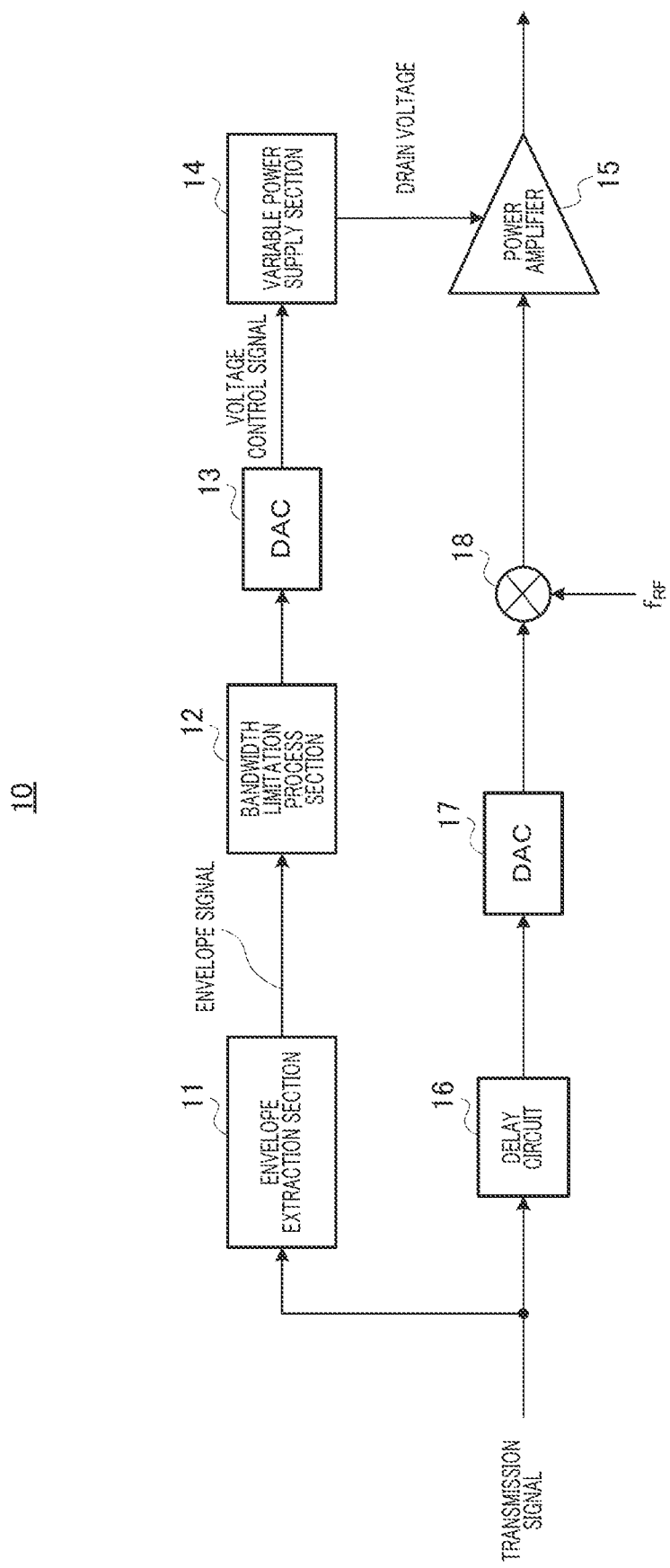
FIG. 1 is a block diagram showing an example of a configuration of a conventional transmission circuit.
Figure 2:
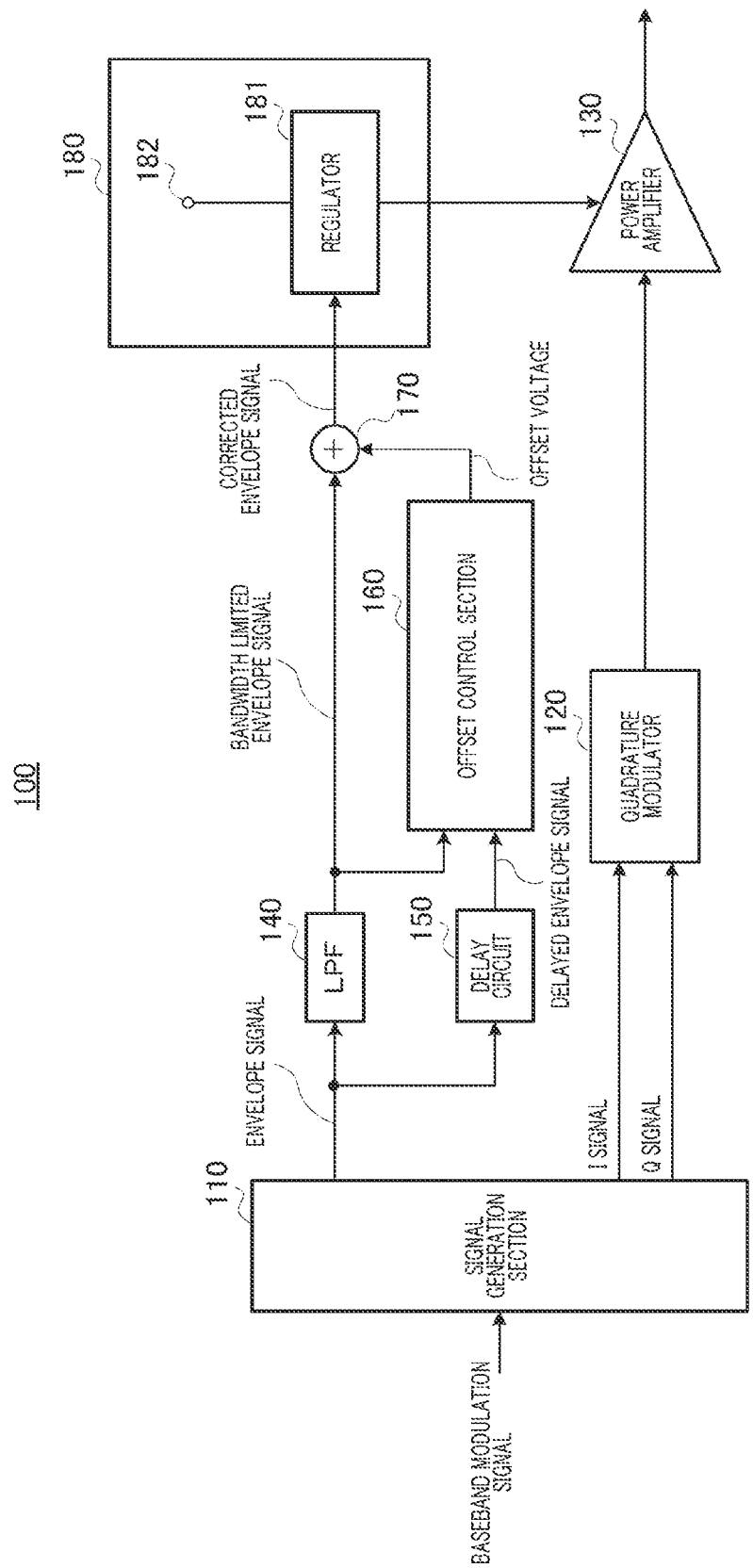
FIG. 2 is a block diagram showing a principal-part configuration of a transmission circuit according to Embodiment 1 of the present invention.

FIG. 2 is a block diagram showing a principal-part configuration of a transmission circuit according to the present embodiment. In FIG. 2, transmission circuit 100 includes signal generation section 110, quadrature modulator 120, power amplifier (PA) 130, low pass filter (LPF) 140, delay circuit 150, offset control section 160, adder 170, and power supply voltage control section 180.

In transmission circuit 100, signal generation section 110 receives a baseband modulation signal as an input signal. Signal generation section 110 performs predetermined signal processing on the baseband modulation signal to generate and output an in-phase component, a quadrature-phase component, and envelope information, as an I SIGNAL, a Q SIGNAL, and an envelope signal, respectively. Signal generation section 110 outputs the I signal and the Q signal to quadrature modulator 120, and outputs the envelope signal to LPF 140 and delay circuit 150.

Quadrature modulator 120 quadrature-modulates the I signal and the Q signal, and outputs the quadrature-modulated signal as a vector modulation wave.

Power amplifier 130 amplifies the vector modulation wave according to power supply voltage input to a power supply voltage terminal, and outputs the amplified wave as a transmission signal. Power amplifier 130 includes, for example, a bipolar transistor, a field effect transistor (FET), or a heterojunction bipolar transistor (HBT).

LPF 140 performs bandwidth limitation on the envelope signal, and outputs an envelope signal after bandwidth limitation (hereinafter referred to as "bandwidth limited envelope signal").

Delay circuit 150 delays the envelope signal for a predetermined time, and outputs the delayed envelope signal (hereinafter referred to as "delayed envelope signal"). Here, "predetermined time" refers to a time corresponding to the amount of delay of LPF 140.

Offset control section 160 sets offset voltage based on the bandwidth limited envelope signal and the delayed envelope signal, and outputs the set offset voltage to adder 170. Specifically, offset control section 160 sets the voltage that makes the level of a corrected envelope signal (described later) equal to or higher than the level of the delayed envelope signal, as offset voltage. A method of setting offset voltage in offset control section 160 will be described later.

Adder 170 corrects the bandwidth limited envelope signal by adding the offset voltage to the bandwidth limited envelope signal, and outputs the corrected bandwidth limited envelope signal (hereinafter referred to as "corrected envelope signal") to power supply voltage control section 180.

Power supply voltage control section 180 includes regulator 181 and power supply terminal 182.

Regulator 181 supplies voltage corresponding to the corrected envelope signal, as power supply voltage (collector voltage or drain voltage) of power amplifier 130, to a power supply voltage terminal (collector terminal or drain terminal) of power amplifier 130. Typically, regulator 181 supplies voltage that is proportional to the level of the corrected envelope signal, to power amplifier 130.

Figure 3A:
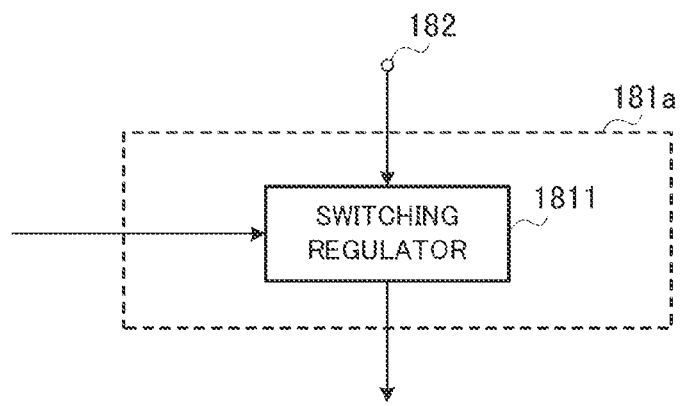
FIG. 3A-3C shows an internal configuration of a regulator.
Figure 3B:
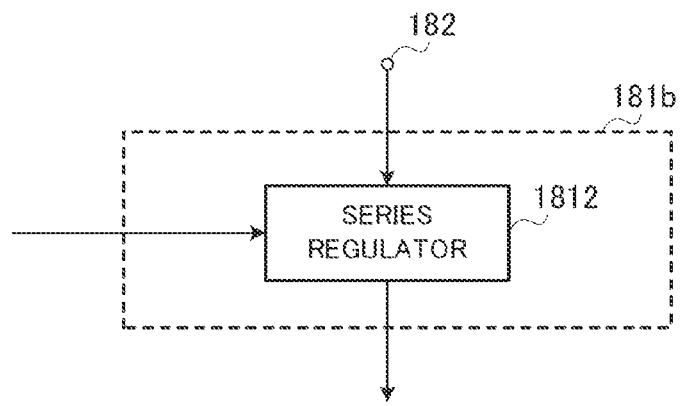

Regulator 181 can be configured with switching regulator 1811, as is the case with, for example, regulator 181*a* shown in FIG. 3A. In regulator 181*a*, switching regulator 1811 transforms direct current voltage supplied from power supply terminal 182 into the voltage corresponding to the input signal, and supplies the transformed voltage to power amplifier 130. Further, regulator 181 can be configured with series regulator 1812, as is the case with regulator 181*b* shown in FIG. 3B.

Figure 3C:
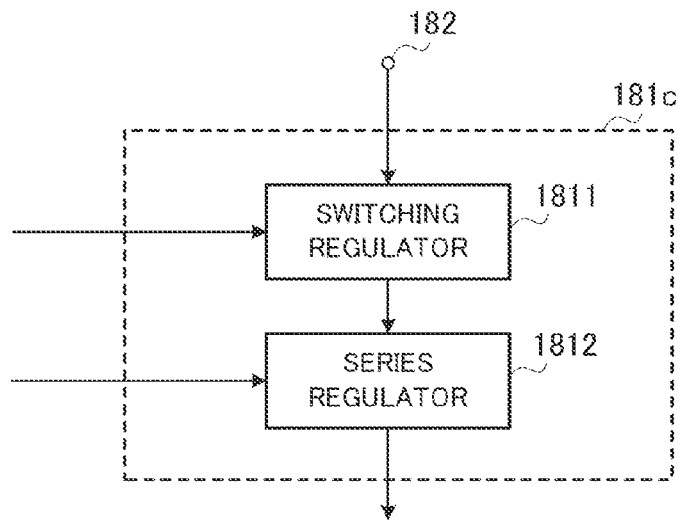

Further, regulator 181 can be configured with combination of switching regulator 1811 and series regulator 1812, as is the case with regulator 181c shown in FIG. 3C. Further, it is possible to configure regulator 181 using a current-driven regulator.

An operation of transmission circuit 100 configured as described above will be described below.

Signal generation section 110 outputs an in-phase component, a quadrature-phase component, and envelope information, as an I signal, a Q signal, and an envelope signal, respectively, based on the input baseband modulation signal. The I signal and Q signal are quadrature-modulated in quadrature modulator 120, and are input as a vector modulation wave to power amplifier 130. On the other hand, the envelope signal is input to LPF 140 and delay circuit 150.

The envelope signal input to LPF 140 receives predetermined bandwidth limitation processing, and then is input as a bandwidth limited envelope signal to offset control section 160 and adder 170.

On the other hand, the envelope signal input to delay circuit 150 is delayed for a time corresponding to the amount of delay of LPF 140, and then is input as a delayed envelope signal to offset control section 160.

Offset control section 160 sets offset voltage based on the bandwidth limited envelope signal input from LPF 140 and the delayed envelope signal input from delay circuit 150. Specifically, offset control section 160 calculates a difference in voltage level (difference voltage) between the corrected envelope signal, which is an output signal from adder 170, and a delayed envelope signal, which is an output signal from delay circuit 150.

Offset control section 160 sets the voltage that does not make the corrected envelope signal level lower than the delayed envelope signal level, as offset voltage, based on the difference voltage. That is, offset control section 160 sets the voltage that makes the corrected envelope signal level equal to or higher than the delayed envelope signal level, as offset voltage. In the case where the bandwidth limited envelope signal level is smaller than the delayed envelope signal level, offset control section 160 outputs offset voltage that is equal to or higher than the difference voltage between the bandwidth limited envelope signal and the delayed envelope signal, to perform control so that the corrected envelope signal level is not lower than the delayed envelope signal level.

In the case of assuming an ideal regulator without being subjected to bandwidth limitation, when the corrected envelope signal level matches the delayed envelope signal level, an output signal of regulator 181 becomes optimal power supply voltage of power amplifier 130. When the power supply voltage is lower than the optimal power supply voltage, the linearity of the output signal of power amplifier 130 deteriorates. Power supply voltage becomes lower than the optimal power supply voltage when the corrected envelope signal level is lower than the delayed envelope signal level. That is, when the corrected envelope signal level is lower than the delayed envelope signal level, the linearity of an output signal of power amplifier 130 deteriorates.

Therefore, according to the present embodiment, offset control section 160 controls offset voltage so that the corrected envelope signal level is equal to or higher than the delayed envelope signal level, as above described, and therefore the linearity of an output signal of power amplifier 130 does not deteriorate.

Offset control section 160 supplies the set offset voltage to adder 170.

Adder 170 adds the offset voltage to the bandwidth limited envelope signal, and outputs the added signal as a corrected envelope signal.

The corrected envelope signal receives predetermined voltage conversion in regulator 181, and the voltage after voltage conversion is supplied as power supply voltage (collector voltage or drain voltage) of power amplifier 130 to the power supply voltage terminal (collector terminal or drain terminal).

Figure 4:
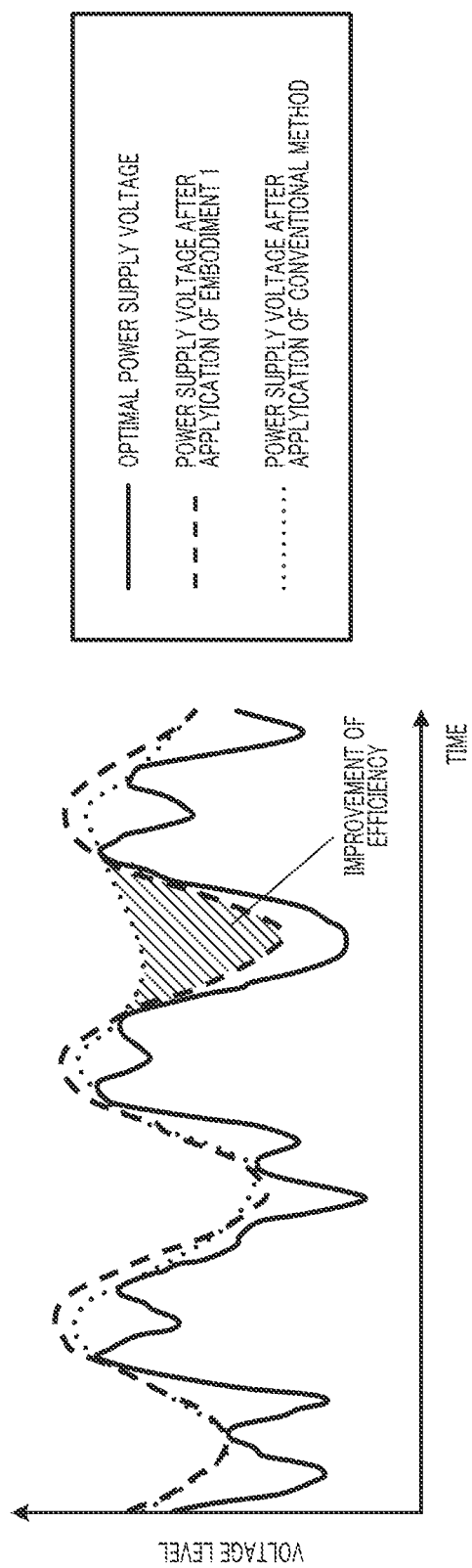
FIG. 4 shows an example of power supply voltage according to Embodiment 1 and a conventional method.

FIG. 4 shows power supply voltage of power amplifier 130. FIG. 4 shows optimal power supply voltage, power supply voltage after application of a method of the present embodiment, and power supply voltage after application of a conventional method. The conventional method is the method described in Patent Literature 1.

With the present embodiment and the conventional method, the power supply voltage does not become lower than the optimal power supply voltage. According to the present embodiment, it is shown that the power supply voltage in the case of a low voltage level is closer to the optimal power supply voltage, compared to the conventional method. Part of the power supply voltage exceeding the optimal power supply voltage is loss in power amplifier 130, and lowers the efficiency. That is, transmission circuit 100 according to the present embodiment can operate more efficiently than the transmission circuit of the conventional method.

As described above, according to the present embodiment, offset control section 160 sets the voltage that makes the corrected envelope signal level equal to or higher than the delayed envelope signal level, as offset voltage. By this means, the corrected envelope signal level becomes equal to or higher than the delayed envelope signal level, so that it is possible to prevent the power supply voltage from being lower than the optimal power supply voltage, making it possible to prevent the linearity of an output signal from deteriorating in power amplifier 130.

Further, according to the present embodiment, it is not necessary to set the frequency bandwidth (response speed) of power supply voltage control section 180 based on the frequency band of an output signal of LPF 140, so that it is possible to improve the flexibility in designing power supply voltage control section 180.

Further, the cut-off frequency of LPF 140 needs to be set equal to or narrower than the bandwidth of regulator 181. This is because, when setting the cut-off frequency of LPF 140 wider than the bandwidth of regulator 181, an input signal receives bandwidth limitation in regulator 181, causing the problem of change of an output signal level.

Further, in the case where an element having a narrower bandwidth than regulator 181 is present in the path from adder 170 to power amplifier 130, it is desirable to set the cut-off frequency of LPF 140 equal to or narrower than the bandwidth of the element having a narrower bandwidth than regulator 181.

Further, according to the present embodiment, it is possible to use any regulators as long as the cut-off frequency of LPF 140 is set equal to or narrower than the bandwidth of regulator 181.

Embodiment 2

Figure 5:
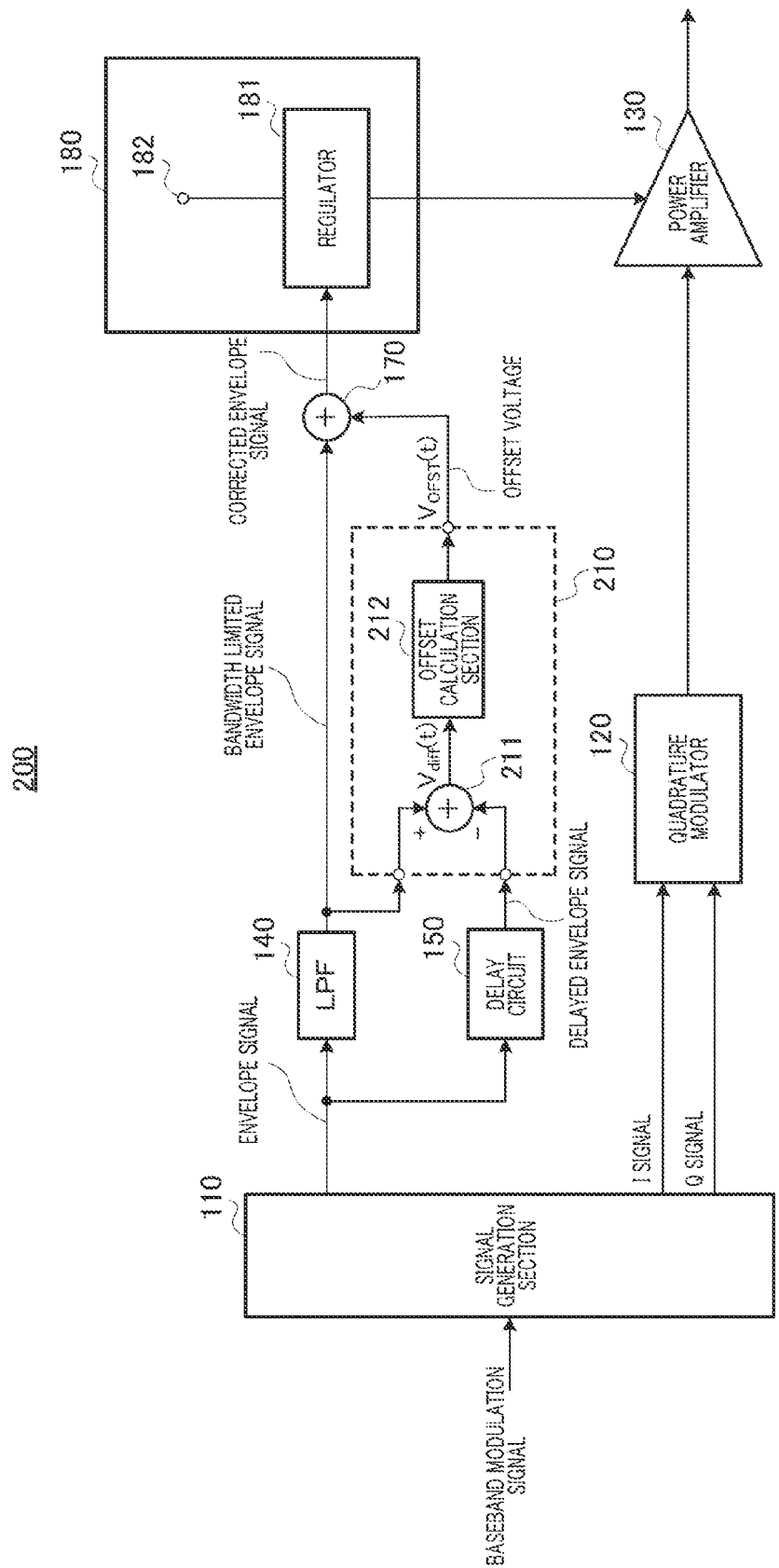
FIG. 5 is a block diagram showing a principal-part configuration of a transmission circuit according to Embodiment 2 of the present invention.

FIG. 5 is a block diagram showing a principal-part configuration of a transmission circuit according to the present embodiment. In the transmission circuit of FIG. 5 according to the present embodiment, components that are the same as in FIG. 2 will be assigned the same reference numerals as in FIG. 2 and overlapping explanations will be omitted. Compared to transmission circuit 100 of FIG. 2, transmission circuit 200 of FIG. 5 includes offset control section 210 instead of offset control section 160.

Offset control section 210 includes subtractor 211 and offset calculation section 212.

Subtractor 211 receives as input a bandwidth limited envelope signal and a delayed envelope signal. Subtractor 211 subtracts the delayed envelope signal from the bandwidth limited envelope signal, outputs the calculation result as a subtracted signal, and supplies the subtracted signal to offset calculation section 212.

Offset calculation section 212 performs predetermined calculation based on the subtracted signal to set offset voltage, and supplies the offset voltage to adder 170. Further, offset calculation section 212 includes a memory inside and maintains the set offset voltage in the memory.

A method of setting offset voltage in offset control section 210 will be described below. In the following description, a bandwidth limited envelope signal level at certain clock time t is set as $V_{LPF}(t)$, a delayed envelope signal level is set as $V_{dly}(t)$, and a corrected envelope signal is set as $V_{mod}(t)$.

[Method of Setting Offset Voltage #1]

[1-1]: Subtractor 211 subtracts delayed envelope signal level $V_{dly}(t)$ from bandwidth limited envelope signal level $V_{LPF}(t)$ according to equation 1, and outputs subtracted signal $V_{diff}(t)$. Subtracted signal $V_{diff}(t)$ represents a signal component that is removed from an envelope signal after the envelope signal is averaged by band limitation in LPF 140 (also referred to as "removed component or suppressed component." Hereinafter referred to as "removed component").

[1]

$$V_{diff}(t) = V_{LPF}(t) - V_{dly}(t) \quad \text{(Equation 1)}$$

[1-2]: Offset calculation section 212 reads offset voltage before one clock time $V_{OFST}(t-1)$ that is maintained inside.

[1-3]: Offset calculation section 212 calculates equation 2-1. Equation 2-2 is produced by substituting equation 1 in equation 2-1.

(Equation 2-1)
$$\Delta V(t) = V_{diff}(t) + V_{OFST}(t-1) \quad [2]$$

(Equation 2-2)
$$\Delta V(t) = V_{LPF}(t) + V_{OFST}(t-1) - V_{dly}(t)$$
$$= V_{mod}(t) - V_{dly}(t)$$

As is clear from equation 2-2, $\Delta V(t)$ indicates the scale of the removed component that remains when a corrected envelope signal is generated by correcting a bandwidth limited envelope signal in adder 170 using offset voltage before one clock time $V_{OFST}(t-1)$. In other words, $\Delta V(t)$ is the amount of voltage that needs to be further corrected when offset voltage before one clock time $V_{OFST}(t-1)$ is used (hereinafter referred to as "target amount of correction").

As described in Embodiment 1, when corrected envelope signal level $V_{mod}(t)$ is lower than delayed envelope signal level $V_{dly}(t)$, the linearity of an output signal of power amplifier 130 deteriorates. Therefore, according to the present embodiment, offset voltage $V_{OFST}(t)$ is set, based on the scale of target amount of correction $\Delta V(t)$ that remains when a bandwidth limited envelope signal is corrected in adder 170 using offset voltage before one clock time $V_{OFST}(t-1)$, as described in following [1-4] and [1-5].

[1-4] Offset calculation section 212 compares $\Delta V(t)$ with a predetermined threshold value to determine offset voltage change step amount $\Delta V_{OFST}(t)$ corresponding to the result of the comparison. Specifically, offset calculation section 212 maintains a look up table (LUT) such as that shown in FIG. 6, and determines offset voltage change step amount $\Delta V_{OFST}(t)$ using the LUT.

As shown in FIG. 6, in the LUT, $\Delta V(t)$ is associated with $\Delta V_{OFST}(t)$. More specifically, when $\Delta V(t)$ is smaller than $V_{th1}$ ($V_{th1} \geq 0$), $V_{STEP1}$ ($V_{STEP1} \geq 0$) is associated with $\Delta V(t)$, as $\Delta V_{OFST}(t)$. Further, when $\Delta V(t)$ is greater than $V_{th2}$ ($V_{th2} > V_{th1}$), $V_{STEP2}$ ($V_{STEP2} \leq 0$) is associated with $\Delta V(t)$, as $\Delta V_{OFST}(t)$. Further, when $V_{th1} \leq \Delta V(t) \leq V_{th2}$ is satisfied for $\Delta V(t)$, 0 is associated with $\Delta V(t)$, as $\Delta V_{OFST}(t)$.

Therefore, when $\Delta V(t)$ is smaller than $V_{th1}$, offset calculation section 212 using the LUT shown in FIG. 6 determines $\Delta V_{OFST}(t)$ as $V_{STEP1}$. Likewise, when $\Delta V(t)$ is greater than $V_{th2}$, $\Delta V_{OFST}(t)$ is determined as $V_{STEP2}$. Further, when $\Delta V(t)$ is $V_{th1}$ or greater and $V_{th2}$ or smaller, $\Delta V_{OFST})(t)$ is determined as 0.

Offset calculation section 212 includes an LUT in which target amount of correction $\Delta V(t)$ that is determined by equation 2-2 according to subtracted signal $V_{diff}(t)$ is associated with offset voltage change step amount $\Delta V_{OFST}(t)$. In the LUT, each different step size is associated with target amount of correction $\Delta V(t)$, as offset voltage change step amount $\Delta V_{OFST}(t)$, according to the result of comparison between target amount of correction $\Delta V(t)$ and a plurality of threshold values.

Offset calculation section 212 determines offset voltage change step amount $\Delta V_{OFST}(t)$ from a plurality of candidates of the change step amount (that is, $V_{STEP1}$, 0, or $V_{STEP2}$), according to target amount of correction $\Delta V(t)$ that is determined based on the subtracted signal from subtractor 211.

[1-5]: Offset calculation section 212 sets offset voltage $V_{OFST}(t)$ according to equation 3.

[3]

$$V_{OFST}(t) = V_{OFST}(t-1) + \Delta V_{OFST}(t) \quad \text{(Equation 3)}$$

According to the present embodiment, when $\Delta V(t) < V_{th1}$ ($V_{th1} \geq 0$) is satisfied for target amount of correction $\Delta V(t)$, it is difficult to sufficiently interpolate a removed component, even when using offset voltage before one clock time $V_{OFST}(t-1)$, so that voltage determined by further adding $V_{STEP1}$ ($V_{th1} \geq 0$), as $V_{OFST}(t)$, to offset voltage before one clock time $V_{OFST}(t-1)$, is set as offset voltage $V_{OFST}(t)$ at clock t.

Further, when $\Delta V(t) > V_{th2}$ ($V_{th2} > V_{th1}$) is satisfied, a removed component is interpolated too much when using offset voltage before one clock time $V_{OFST}(t-1)$, so that voltage that is determined by further adding $V_{STEP2}$ ($V_{STEP2} \leq 0$), as $\Delta V_{OFST}(t)$, to offset voltage before one clock time $V_{OFST}(t-1)$, as offset voltage $V_{OFST}(t)$ at clock t.

Further, when $V_{th1} \leq \Delta V(t) \leq V_{th2}$ is satisfied for $\Delta V(t)$, a removed component is interpolated adequately when using offset voltage before one clock time $V_{OFST}(t-1)$, so that, by setting $\Delta V_{OFST}(t) = 0$, offset voltage before one clock time $V_{OFST}(t-1)$ is set as offset voltage $V_{OFST}(t)$ at clock t.

As described above, according to the present embodiment, the difference of offset voltage $V_{OFST}(t)$ of around one clock ($\Delta V_{OFST}(t)$) is limited to $V_{STEP1}$, 0, or $V_{STEP2}$ (i.e. either of a plurality of candidates of the change step amount). For this reason, by setting $V_{STEP1}$ and $V_{STEP2}$ at adequate values, even when changing offset voltage $V_{OFST}(t)$, it is possible to prevent the frequency of a corrected envelope signal that is generated by adding offset voltage $V_{OFST}(t)$ to a bandwidth limited envelope signal from becoming too wide.

Specifically, it is desirable that $V_{STEP1}$ and $V_{STEP2}$ meet the conditions of following Equation 4-1 and Equation 4-2.

(Equation 4-1)

$$|V_{STEP1}| \leq \frac{4f_{regBW}}{f_{clock}} \quad [4]$$

(Equation 4-2)

$$|V_{STEP2}| \leq \frac{4f_{regBW}}{f_{clock}}$$

where, $f_{regBW}$ represents the bandwidth of regulator 181, and $f_{clock}$ represents the clock frequency of offset control section 210.

Greater target amount of correction ΔV(t) indicates that a removed component has been corrected too much. When a removed component has been corrected too much, the efficiency lowers, but the linearity is maintained. On the other hand, smaller target amount of correction ΔV(t) indicates that a removed component has not been corrected sufficiently. When a removed component has not been corrected sufficiently, the linearity cannot be maintained. For this reason, it is preferable that $V_{STEP1}$ that is set to $\Delta V_{OFST}(t)$ when $\Delta V(t) < V_{th1}$ is satisfied and $V_{STEP2}$ that is set to $\Delta V_{OFST}(t)$ when $\Delta V(t) < V_{th2}$ is satisfied, meet $|V_{STEP1}| \geq |V_{STEP2}|$. By this means, it is possible to control power supply voltage by putting more emphasis on the linearity than the efficiency.

[1-6]: Offset calculation section 212 outputs and supplies offset voltage $V_{OFST}(t)$ to adder 170.

Figure 7A:
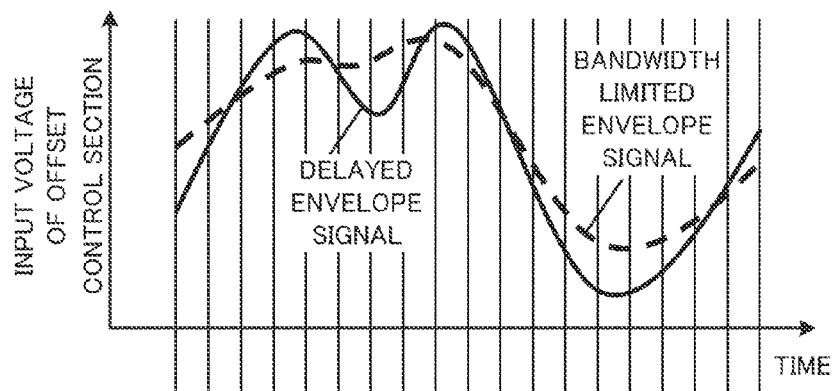
FIG. 7A-7D shows an example of input voltage of an offset control section, output voltage (subtracted signal) of a subtractor, offset voltage, and power supply voltage according to Embodiment 2 and a conventional method.
Figure 7B:
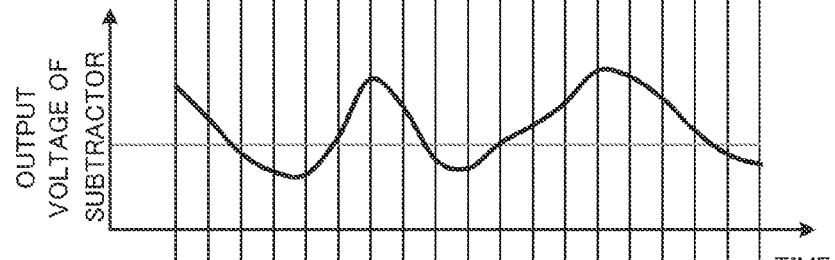
Figure 7C:
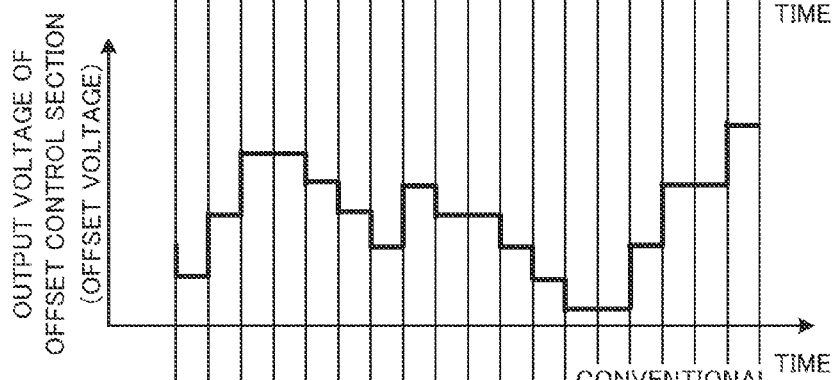
Figure 7D:
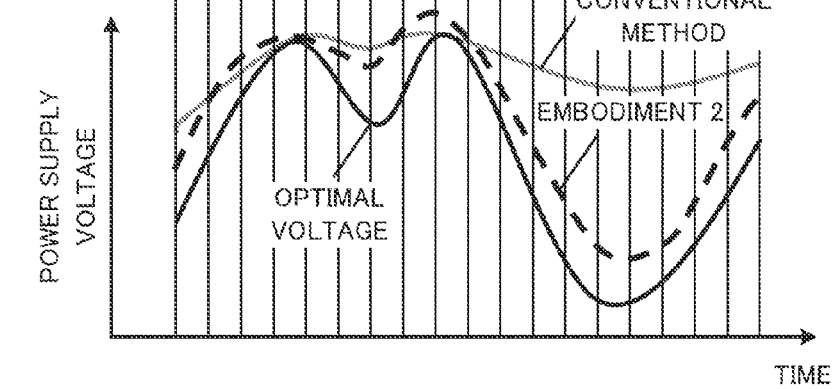

FIG. 7A to FIG. 7D show input voltage of offset control section 210, output voltage (subtracted signal) of subtractor 211, offset voltage, and power supply voltage. FIG. 7A shows voltage levels of a bandwidth limited envelope signal and a delayed envelope signal. FIG. 7B shows output (subtracted signal) of subtractor 211, which is a difference in voltage level between a bandwidth limited envelope signal and a delayed envelope signal. FIG. 7C shows offset voltage set based on output voltage (subtracted signal) of subtractor 211 and offset voltage before one clock. FIG. 7D shows power supply voltage to be input eventually to power amplifier 130.

FIG. 7D shows that, according to the present embodiment, power supply voltage is closer to the optimal voltage and the transmission circuit operates highly efficiently, compared to the case of the conventional method.

As described above, according to the present embodiment, offset voltage change step amount $\Delta V_{OFST}(t)$ is limited. Offset calculation section 212 determines the offset voltage change step amount from a plurality of candidates of the change step amount based on the subtracted signal from subtractor 211, to set offset voltage. By this means, it is possible to prevent the frequency of a corrected envelope signal from becoming too wide, making it possible to prevent the linearity of an output signal from deteriorating and suppress occurrence of distortion of the output signal, in power amplifier 130. Further, offset control section 210 sets the voltage that makes the corrected envelope signal level equal to or higher than the delayed envelope signal level, as offset voltage, so that power supply voltage becomes closer to the optimal power supply voltage. For this reason, power amplifier 130 can operate efficiently.

Although two threshold values of $V_{th1}$ and $V_{th2}$ that are subject to comparison with target amount of correction ΔV are used in the LUT shown in FIG. 6, the number of threshold values is not limited to two. For example, it is possible to use the LUT in which each different step size is associated with target amount of correction ΔV(t), as offset voltage change step amount $\Delta V_{OFST}(t)$, according to the result of comparison between target amount of correction ΔV(t) and a single threshold value or three or more threshold values.

Further, although a case has been described above where, in [1-3], target amount of correction ΔV(t) is calculated according to equation 2-2 based on offset voltage before one clock time $V_{OFST}(t-1)$, the present invention is not limited to this. For example, in [1-3], it is possible to calculate target amount of correction ΔV(t) according to equation 5.

[5]

$$\Delta V(t) = V_{diff}(t) \quad \text{(Equation 5)}$$

In this case, target amount of correction ΔV(t) corresponds to subtracted signal $V_{diff}(t)$ and has the scale of a removed component that needs to be corrected at clock t. In the LUT shown in FIG. 6, by setting $V_{th1}$, $V_{th2}$, $V_{STEP1}$, and $V_{STEP2}$ at values that do not widen the band of a corrected envelope signal, it is possible to prevent the frequency of a corrected envelope signal from becoming too wide, making it possible to prevent the linearity of an output signal from deteriorating and suppress occurrence of distortion of the output signal, in power amplifier 130.

Further, it is possible to realize offset control section 210 using a different configuration, as long as the same result of calculation as the result obtained in the above-described method of setting offset voltage can be obtained. For example, it is possible to reverse positive and negative of subtractor 211 to reverse the signs used in the subsequent calculation.

As described above, according to the present embodiment, in offset control section 210, subtractor 211 subtracts the delayed envelope signal level from the bandwidth limited envelope signal level, outputs the calculation result as a subtracted signal, and offset calculation section 212 determines the change step amount of offset voltage from a plurality of candidates of the change step amount, based on the subtracted signal, and sets offset voltage using the determined change step. Offset calculation section 212 obtains change step amount $\Delta V_{OFST}(t)$ that is associated with target amount of correction ΔV(t), from the LUT in which target amount of correction ΔV(t) that is determined according to the subtracted signal is associated with change step amount $\Delta V_{OFST}(t)$ of offset voltage, to set offset voltage using change step amount $\Delta V_{OFST}(t)$. In the LUT according to the present embodiment, depending on the result of comparison between target amount of correction ΔV(t) and a plurality of threshold values, a different candidate of the change step amount is associated with target amount of correction ΔV(t), as change step amount $\Delta V_{OFST}(t)$.

By this means, it is possible to prevent the frequency of a corrected envelope signal from becoming too wide, making it possible to prevent the linearity of an output signal from deteriorating and suppress occurrence of distortion of the output signal, in power amplifier 130. Further, offset control section 210 sets the voltage that makes the corrected envelope signal level equal to or higher than the delayed envelope signal level, as offset voltage, so that power supply voltage becomes closer to the optimal power supply voltage. For this reason, power amplifier 130 can operate efficiently.

Embodiment 3

Figure 8:
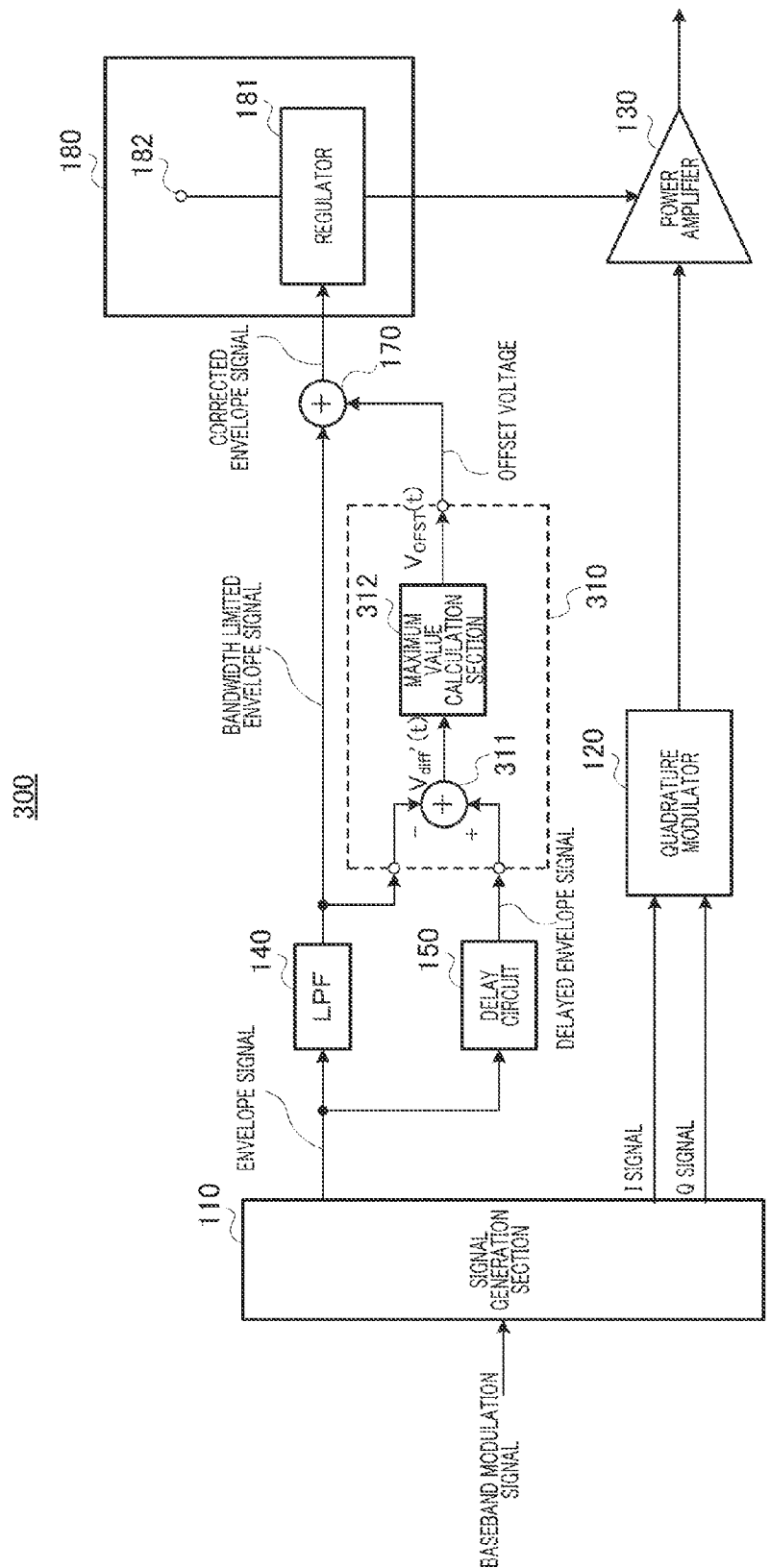
FIG. 8 is a block diagram showing a principal-part configuration of a transmission circuit according to Embodiment 3 of the present invention.

FIG. 8 is a block diagram showing a principal-part configuration of a transmission circuit according to the present embodiment. In the transmission circuit of FIG. 8 according to the present embodiment, components that are the same as in FIG. 2 will be assigned the same reference numerals as in FIG. 2 and overlapping explanations will be omitted. Compared to transmission circuit 100 of FIG. 2, transmission circuit 300 of FIG. 8 includes offset control section 310 instead of offset control section 160.

Offset control section 310 includes subtractor 311 and maximum value calculation section 312.

Subtractor 311 receives as input a bandwidth limited envelope signal and a delayed envelope signal. Subtractor 311 subtracts a bandwidth limited envelope signal from a delayed envelope signal, and outputs and supplies the calculation result as a subtracted signal to maximum value calculation section 312.

Maximum value calculation section 312 calculates the maximum value of a subtracted signal in a certain period, sets the maximum value to offset voltage, and outputs the maximum value to adder 170. Further, offset calculation section 312 includes a memory inside and maintains the set offset voltage in the memory.

A method of setting offset voltage in offset control section 310 will be described below. In the following description, in the same way as in Embodiment 1, a bandwidth limited envelope signal level at certain clock time t is set as $V_{LPF}(t)$, a delayed envelope signal level is set as $V_{dly}(t)$, and a corrected envelope signal is set as $V_{mod}(t)$.

[Method of Setting Offset Voltage #2]

[2-1] Subtractor 311 subtracts bandwidth limited envelope signal level $V_{LPF}(t)$ from delayed envelope signal level $V_{dly}(t)$ according to equation 6, and outputs subtracted signal $V_{diff}'(t)$. Subtracted signal $V_{diff}'(t)$ represents a signal component that is removed from an envelope signal after the envelope signal is averaged by band limitation in LPF 140 (also referred to as "code reversed removed component," or "code reversed suppressed component." Hereinafter referred to as "code reversed removed component").

[6]

$$V_{diff}'(t)=V_{dly}(t)-V_{LPF}(t) \quad \text{(Equation 6)}$$

[2-2] Maximum value calculation section 312 extracts the maximum subtracted signal out of subtracted signals $V_{diff}'(t-n)$, $V_{diff}'(t-n+1)$, $V_{diff}'(t-1)$ in certain periods (t-n) to (t-1) that are maintained inside, and set the extracted maximum subtracted signal as maximum voltage Vmax(t).

[2-3] Maximum value calculation section 312 compares $V_{diff}'(t)$ with $V_{max}(t)$, and sets the greater value as offset voltage $V_{OFST}(t)$.

[2-4] maximum value calculation section 312 outputs and supplies set offset voltage $V_{OFST}(t)$ to adder 170.

That is, offset control section 310 sets the smallest possible voltage as offset voltage, out of the voltages that make the corrected envelope signal level equal to or higher than the delayed envelope signal level.

Figure 9A:
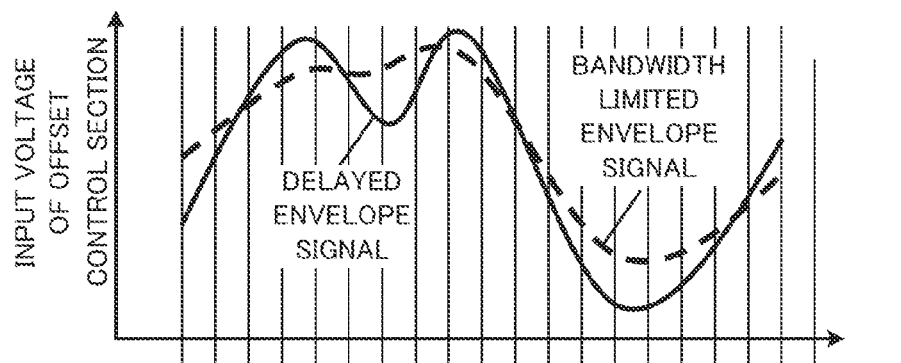
FIG. 9A-9D shows an example of input voltage of an offset control section, output voltage (subtracted signal) of a subtractor, offset voltage, and power supply voltage according to Embodiment 3 and a conventional method.
Figure 9B:
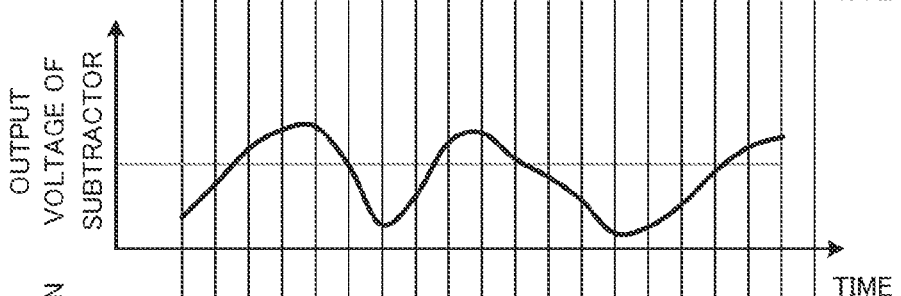
Figure 9C:
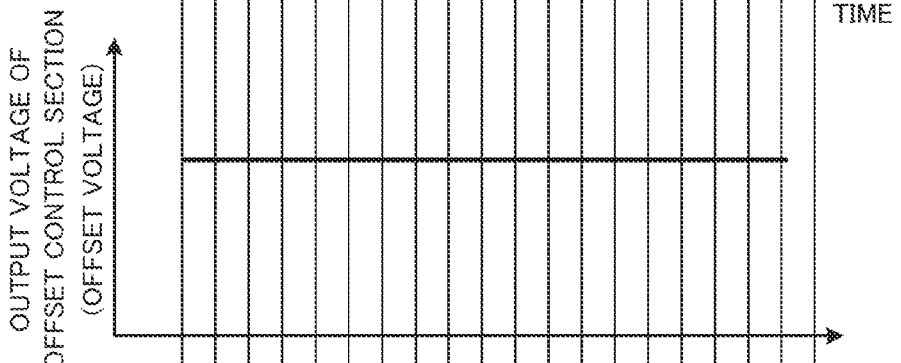
Figure 9D:
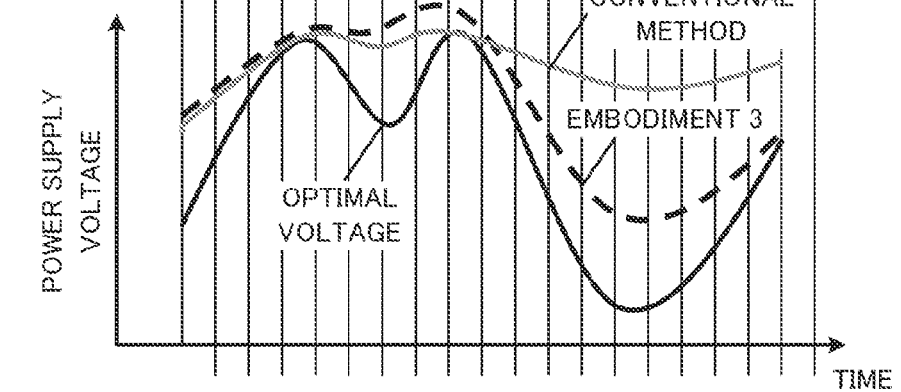

FIG. 9A to FIG. 9D show input voltage of offset control section 310, output voltage (subtracted signal) of subtractor 311, offset voltage, and power supply voltage. FIG. 9A shows voltage levels of a bandwidth limited envelope signal and a delayed envelope signal. FIG. 9B shows output voltage (subtracted signal) of subtractor 311, which is a difference in voltage level between a bandwidth limited envelope signal and a delayed envelope signal. FIG. 9C shows offset voltage set based on the maximum voltage of output voltage (subtracted signal) of subtractor 311. FIG. 9D shows power supply voltage to be input eventually to power amplifier 130.

FIG. 9D shows that, according to the present embodiment, because offset control section 310 sets the smallest possible voltage as offset voltage, out of the voltages that make the corrected envelope signal level equal to or higher than the delayed envelope signal level, so that, it is shown that power supply voltage is closer to the optimal voltage and the transmission circuit operates highly efficiently, compared to the case of the conventional method.

As described above, according to the present embodiment, offset voltage change step amount $\Delta V_{OFST}(t)$ is limited. Specifically, maximum value calculation section 312 sets the maximum voltage of a subtracted signal output from subtractor 311 in a certain period, as offset voltage. That is, change step amount of offset voltage $\Delta V_{OFST}(t)$, which is a difference of offset voltage $V_{OFST}(t)$ in around one clock, is limited to 0. Therefore, it is possible to prevent the frequency of a corrected envelope signal that is generated by adding offset voltage $V_{OFST}(t)$ to a bandwidth limited envelope signal from becoming too wide, so that it is possible to prevent the linearity of an output signal from deteriorating and suppress occurrence of distortion of the output signal, in power amplifier 130.

Further, offset control section 310 sets the smallest possible voltage, out of the voltages that make the corrected envelope signal level equal to or higher than the delayed envelope signal level, as offset voltage, so that power supply voltage becomes closer to the optimal power supply voltage. For this reason, power amplifier 130 can operate efficiently.

In above-described [2-2], when a certain period is too short, there is a likelihood that maximum power that can be obtained in maximum value calculation section 312 is too high or too low, so that it may be difficult to sufficiently control power supply voltage of power amplifier 130. On the other hand, when a certain period is too long, it is difficult for a corrected envelope signal to follow a delayed envelope signal, lowering the efficiency or causing an increase in the capacity memory for storing a subtracted signal. For this reason, it is desirable to set a certain period of 1 us or longer and 10 ms or shorter.

Further, it is possible to set offset voltage by following [2-2'] to [2-3'] instead of above-described [2-2] and [2-3].

[Method of Setting Offset Voltage #2']

[2-2'] Offset calculation section 312 reads offset voltage before one clock time $V_{OFST}(t-1)$ that is maintained inside.

[2-3'] Maximum value calculation section 312 compares $V_{diff}'(t)$ with $V_{OFST}(t-1)$, and sets the greater value as offset voltage $V_{OFST}(t)$.

Because maximum value calculation section 312 only needs to maintain offset voltage before one clock time $V_{OFST}(t-1)$, it is possible to reduce the memory capacity, compared to using [2-3].

In [2-3] and [2-3'], when calculating offset voltage $V_{OFST}(t)$, maximum value calculation section 312 can, for example, perform addition or subtraction on a predetermined offset value, taking into account the characteristics of power amplifier 130.

As described above, according to the present embodiment, in offset control section 160, subtractor 311 outputs the result of subtracting the bandwidth limited envelope signal level from the delayed envelope signal level, and maximum value calculation section 312 calculates the maximum value in a certain period of an output signal of subtractor 311 to set the maximum value as offset voltage. By this means, it is possible to prevent the frequency of a corrected envelope signal from becoming too wide, making it possible to prevent the linearity of an output signal from deteriorating and suppress occurrence of distortion of the output signal, in power amplifier 130. Further, offset control section 310 sets the smallest possible voltage as offset voltage, out of the voltages that make the corrected envelope signal level equal to or higher than the delayed envelope signal level, so that power supply voltage becomes closer to the optimal power supply voltage. For this reason, power amplifier 130 can operate efficiently.

Embodiment 4

Figure 10:
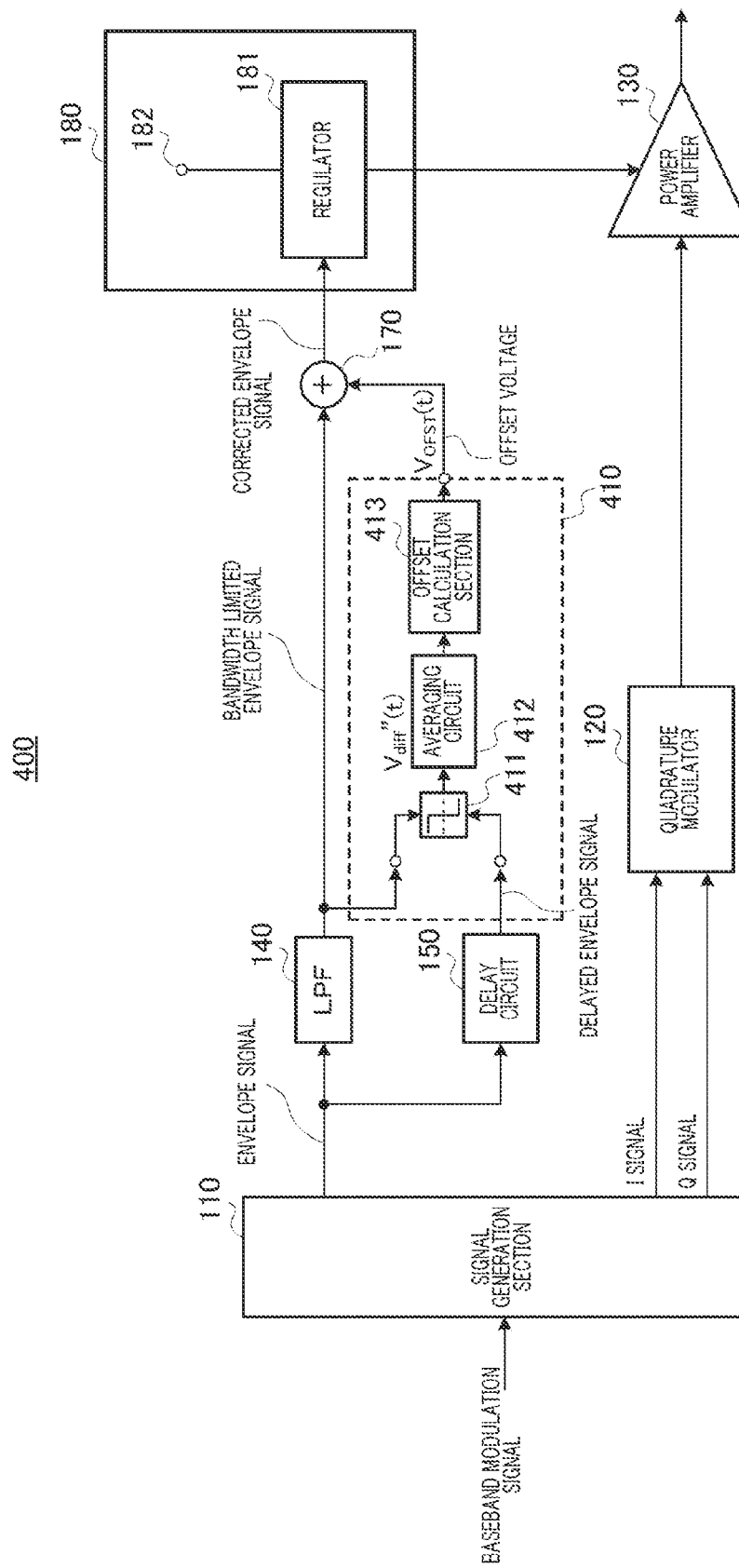
FIG. 10 is a block diagram showing a principal-part configuration of a transmission circuit according to Embodiment 4 of the present invention.

FIG. 10 is a block diagram showing a principal-part configuration of the transmission circuit according to the present embodiment. In the transmission circuit of FIG. 10 according to the present embodiment, components that are the same as in FIG. 2 will be assigned the same reference numerals as in FIG. 2 and overlapping explanations will be omitted. Compared to transmission circuit 100 of FIG. 2, transmission circuit 400 of FIG. 10 includes offset control section 410 instead of offset control section 160.

Offset control section 410 includes comparator 411, averaging circuit 412, and offset calculation section 413.

Comparator 411 receives as input a bandwidth limited envelope signal and a delayed envelope signal. Comparator 411 compares the bandwidth limited envelope signal level with the delayed envelope signal level, and when the bandwidth limited envelope signal level is the higher, supplies 1 as the comparison result, and when the delayed envelope signal level is the higher, supplies 0 as the comparison result, to averaging circuit 412.

Averaging circuit 412 averages the input comparison result to generate an averaged signal, and supplies the averaged signal to offset calculation section 413.

Offset calculation section 413 performs a predetermined calculation based on the input averaged signal to set offset voltage, and supplies the offset voltage to adder 170. Further, offset calculation section 413 includes a memory inside and maintains the set offset voltage in the memory.

Here, averaged signal $V_{diff}''(t)$ is typically a value that is proportional to the value obtained by subtracting the delayed envelope signal level from the bandwidth limited envelope signal level. That is, average signal $V_{diff}''(t)$ is a value that is proportional to an output signal of subtractor 211 of transmission circuit 200 according to Embodiment 2. It can be said that comparator 411 and averaging circuit 412 include the function of subtractor 211.

Therefore, offset calculation section 413 can set offset voltage using the same method as [Method of Setting Offset Voltage #1] in offset calculation section 212.

A method of setting offset voltage in offset control section 310 will be described below. In the following description, a bandwidth limited envelope signal level at certain clock time t is set as $V_{LPF}(t)$, a delayed envelope signal level is set as $V_{dly}(t)$, and a corrected envelope signal is set as $V_{mod}(t)$.

[Method of Setting Offset Voltage #3]

[3-1]: Comparator 411 compares bandwidth limited envelope signal level $V_{LPF}(t)$ with delayed envelope signal level $V_{dly}(t)$, and when bandwidth limited envelope signal level $V_{LPF}(t)$ is the higher, supplies 1 as the comparison result, and when delayed envelope signal level $V_{dly}(t)$ is the higher, supplies 0 as the comparison result, to averaging circuit 412. Averaging circuit 412 averages the input comparison result to generate averaged signal $V_{diff}''(t)$, and outputs averaged signal $V_{diff}''(t)$.

[3-2] Offset calculation section 413 reads offset voltage before one clock time $V_{OFST}(t-1)$ that is maintained inside.

[3-3] Offset calculation section 413 calculates following equation 7.

[7]

$$\Delta V(t) = V_{diff}''(t) + V_{OFST}(t-1)$$ (Equation 7)

[3-4] In offset calculation section 413, comparison between $\Delta V(t)$ and a predetermined threshold value is performed to determine $\Delta V_{OFST}(t)$ according to the comparison result. Specifically, offset calculation section 413 maintains a look up table (LUT) such as that shown in above FIG. 6, and determines offset voltage change step amount $\Delta V_{OFST}(t)$ using the LUT.

[3-5] In offset calculation section 413, offset voltage $V_{OFST}(t)$ is calculated according to equation 3.

[3-6] $V_{OFST}(t)$ is output as offset voltage and is supplied to adder 170.

Although two threshold values of $V_{th1}$ and $V_{th2}$ that are subject to comparison with target amount of correction $\Delta V$ are used in the LUT shown in FIG. 6, the number of threshold values is not limited to two. For example, it is possible to use an LUT in which each different step size is associated with target amount of correction $\Delta V(t)$, as offset voltage change step amount $\Delta V_{OFST}(t)$, according to the result of comparison between target amount of correction $\Delta V(t)$ and a single threshold value or three or more threshold values.

Further, although a case has been described with above where, in [3-3], target amount of correction $\Delta V(t)$ is calculated according to equation 2 based on offset voltage before one clock time $V_{OFST}(t-1)$, the present invention is not limited to this. For example, in [3-3], it is possible to calculate target amount of correction $\Delta V(t)$ according to equation 5.

That is, target amount of correction $\Delta V(t)$ corresponds to subtracted signal $V_{diff}(t)$, and has the scale of a code reversed removed component that needs to be corrected at clock t. In the LUT shown in FIG. 6, by setting $V_{th1}$, $V_{th2}$, $V_{STEP1}$, and $V_{STEP2}$ at values that do not widen the band of a corrected envelope signal, it is possible to prevent the frequency of a corrected envelope signal from becoming too wide, making it possible to prevent the linearity of an output signal from deteriorating and suppress occurrence of distortion of the output signal, in power amplifier 130.

Offset calculation section 413 sets offset voltage using the LUT shown in FIG. 6, in the same way as offset calculation section 212. However, according to the present embodiment, offset calculation section 413 sets offset voltage using averaged signal $V_{diff}''(t)$ instead of subtracted signal $V_{diff}'(t)$.

In this case, a plurality of threshold values and the change step amounts in the LUT used by offset calculation section 212 and a plurality of threshold values and the change step amounts of the LUT used by offset calculation section 413, need to be set at different values.

As described above, according to the present embodiment, in offset control section 410, comparator 411 compares the bandwidth limited envelope signal level output from LPF 140 with the delayed envelope signal level output from delay circuit 150 and outputs the comparison result, and averaging circuit 412 averages the output signal of comparator 411 and outputs the averaged result as a subtracted signal. By this means, in the same way as in Embodiment 2, it is possible to prevent the frequency of a corrected envelope signal from becoming too wide, so that it is possible to prevent the linearity of an output signal from deteriorating and suppress occurrence of distortion of the output signal, in power amplifier 130.

Further, offset control section 410 sets the voltage that makes the corrected envelope signal level equal to or higher than the delayed envelope signal level, as offset voltage, so that power supply voltage becomes closer to the optimal power supply voltage, in the same ways as in Embodiment 2. For this reason, power amplifier 130 can operate efficiently.

In the case where a delay time occurs in averaging circuit 412, it is possible to insert a delay circuit between LPF 140 and adder 170 to delay a bandwidth limited envelope signal input to adder 170 for an amount of the delay time that occurs in averaging circuit 412. Further, it is possible to configure offset calculation section 413 to include the function of averaging circuit 412.

Embodiment 5

In the case of taking into account the operating environment of a transmission circuit, when environmental temperature changes, characteristics of power amplifier 130 varies. For example, in a power amplifier configured with a HBT, due to changes of temperature, the relationship between power supply voltage to be supplied to power supply voltage and output power of a power amplifier varies. That is, even when the same power supply voltage is supplied, output power varies according to the temperature. This causes deterioration of the linear characteristics of power amplifier 130, so that, for example, a problem that the interference signal to neighboring frequency bands occurs. For this reason, it is necessary to adaptively compensate temperature against temperature change. Therefore, a transmission circuit that can adaptively compensate temperature against temperature change, will be described with the present embodiment below.

Figure 11:
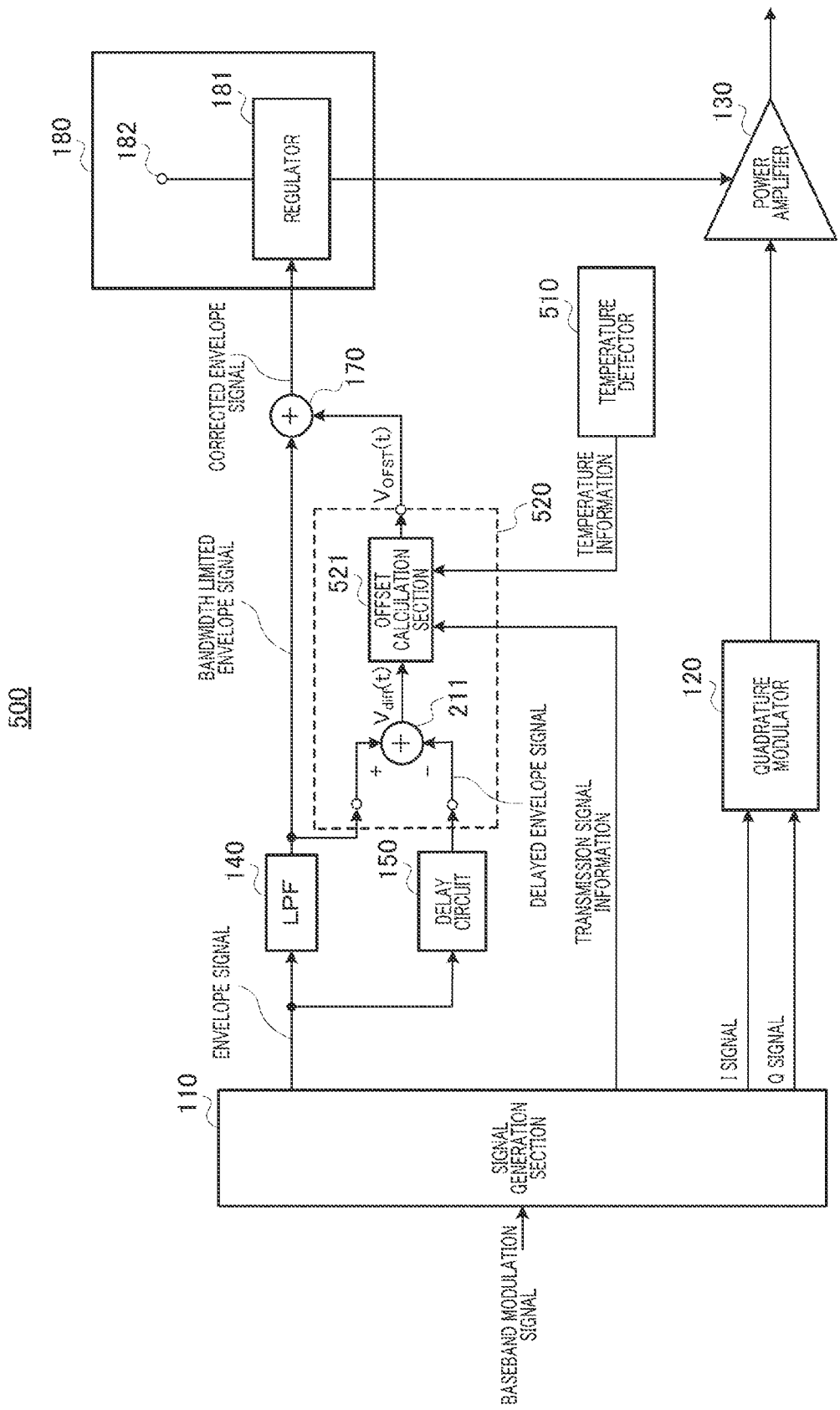
FIG. 11 is a block diagram showing a principal-part configuration of a transmission circuit according to Embodiment 5 of the present invention.

FIG. 11 is a block diagram showing a principal-part configuration of a transmission circuit according to the present embodiment. In the transmission circuit of FIG. 11 according to the present embodiment, components that are the same as in FIG. 2 will be assigned the same reference numerals as in FIG. 2 and overlapping explanations will be omitted. Compared to transmission circuit 100 of FIG. 2, transmission circuit 500 of FIG. 11 includes offset control section 520 instead of offset control section 160 and add temperature detector 510.

Temperature detector 510 measures temperature around power amplifier 130, and outputs information about the measured temperature as temperature information to offset control section 520.

Offset control section 520 includes subtractor 211 and offset calculation section 521.

Offset calculation section 521 receives as input a subtracted signal, transmission signal information, and temperature information. Here, "transmission signal information" is information indicating the transmission band of a transmission signal. Transmission signal information can be information indicating transmission power or information indicating the modulation scheme, for example.

Offset calculation section 521 performs a predetermined calculation based on the subtracted signal, the transmission signal information, and the temperature information, to set and supply offset voltage to adder 170. Further, offset calculation section 512 includes a memory inside and maintains the set offset voltage in the memory.

A method of setting offset voltage in offset control section 520 will be described below. In the following description, a bandwidth limited envelope signal level at certain clock time t is set as $V_{LPF}(t)$, a delayed envelope signal level is set as $V_{dly}(t)$, and a corrected envelope signal is set as $V_{mod}(t)$.

[Method of Setting Offset Voltage #4]

In method of setting offset voltage #1, in [1-4], predetermined threshold values $V_{th1}$ and $V_{th2}$ that are subject to comparison with $\Delta V(t)$, are fixed. In contrast, in method of setting offset voltage #4, predetermined threshold values $V'_{th1}$ and $V'_{th2}$ that are subject to comparison with $\Delta V(t)$ or change step amounts $V_{STEP1}$ and $V'_{STEP2}$ vary based on the transmission signal information or the temperature information. A point that method of setting offset voltage #4 differs from method of setting offset voltage #1 will be mainly described below.

[4-1] In the same way as in [1-1], subtractor 211 subtracts delayed envelope signal level $V_{dly}(t)$ from bandwidth limited envelope signal level $V_{LPF}(t)$ according to equation 1, and outputs subtracted signal $V_{diff}(t)$.

[4-2] In the same way as in [1-2], offset calculation section 512 reads offset voltage before one clock time $V_{OFST}(t-1)$ that is maintained inside.

[4-3] In the same way as in [1-3], offset calculation section 521 calculates equation 2-1.

[4-4] Offset calculation section 521 includes a plurality of LUTs per transmission band of a transmission signal and per temperature of the transmission circuit. Offset calculation section 521 selects one out of a plurality of LUTs based on at least one of transmission signal information indicating the transmission band of a transmission signal and temperature information.

In the LUT, target amount of correction $\Delta V(t)$ determined according to the subtracted signal is associated with change step amount of offset voltage $\Delta V_{OFST}(t)$, per transmission band of a transmission signal and per temperature of the transmission circuit. Offset calculation section 521 selects one out of a plurality of LUTs based on at least one of transmission signal information indicating the transmission band of a transmission signal and temperature information, and in the selected LUT, selects change step amount $\Delta V_{OFST}(t)$ that is associated with target amount of correction $\Delta V(t)$.

[4-5] In the same way as in [1-5], offset calculation section 521 sets offset voltage $V_{OFST}(t)$ according to equation 3.

[4-6] In the same way as in [1-6], offset calculation section 521 outputs and supplies offset voltage $V_{OFST}(t)$ to adder 170.

As described above, according to the present embodiment, temperature detector 510 detects temperature of transmission circuit 500 and outputs the detected temperature as temperature information, and offset control section 520 sets offset voltage based on transmission signal information indicating the transmission band of a transmission signal and temperature information, in addition to a subtracted signal. Specifically, offset calculation section 521 includes a plurality of LUTs in which target amount of correction $\Delta V(t)$ that is determined according to a subtracted signal is associated with change step amount of offset voltage $\Delta V_{OFST}(t)$, per transmission band of a transmission signal and per temperature of the transmission circuit. Offset calculation section 521 selects one out of a plurality of LUTs based on at least one of transmission signal information indicating the transmission band of a transmission signal and temperature information, and in the selected LUT, selects offset voltage using change step amount $\Delta V_{OFST}(t)$ that is associated with target amount of correction $\Delta V(t)$.

By this means, in addition to the effects of Embodiment 2, it is possible to adaptively compensate temperature against temperature changes.

In the case where offset calculation section 521 includes a plurality of LUTs per transmission band and per temperature characteristics, the memory capacity increases. It is possible to identify effects due to a transmission band or temperature characteristics by using, for example, an approximate expression of a linear function.

Therefore, offset calculation section 521 can include one table in which different candidates of the change step amount $V_{STEP1}$ and $V_{STEP2}$ are associated with target amount of correction $\Delta V(t)$, as change step amount $\Delta V_{OFST}(t)$, according to the result of comparison between target amount of correction $\Delta V(t)$ and a plurality of threshold values $V_{th1}$ and $V_{th2}$, in a predetermined band and at predetermined temperature.

Consider a case where offset calculation section 521 includes one LUT such as that shown in FIG. 12. As shown in FIG. 12, in the LUT, $\Delta V(t)$ is associated with $\Delta V_{OFST}(t)$. More specifically, when $\Delta V(t)$ is smaller than $V'_{th1}$ ($V_{th1} \geq 0$), $V_{STEP1}$ ($V_{STEP1} \geq 0$) is associated with $\Delta V(t)$, as $\Delta V_{OFST}(t)$. Further, when $\Delta V(t)$ is greater than $V'_{th2}$ ($V'_{th2} > V'_{th1}$), $V_{STEP2}$ ($V_{STEP2} \leq 0$) is associated with $\Delta V(t)$, as $\Delta V_{OFST}(t)$. Further, when $V'_{th1} \leq \Delta V(t) \leq V'_{th2}$ is satisfied for $\Delta V(t)$, 0 is associated with $\Delta V(t)$, as $\Delta V_{OFST}(t)$.

However, as shown in equation 8-1 to equation 8-4, offset calculation section 521 corrects predetermined threshold values $V'_{th1}$ and $V'_{th2}$ or change step amounts $V'_{STEP1}$ and $V'_{STEP2}$, based on at least one of transmission signal information indicating the transmission band of a transmission signal and temperature information.

[8]

$$V'_{th1} = \alpha_{sig1} \alpha_{temp1} V_{th1} + \beta_{sig1} + \beta_{temp1} \quad \text{(Equation 8-1)}$$

$$V'_{th2} = \alpha_{sig2} \alpha_{temp2} V_{th2} + \beta_{sig2} + \beta_{temp2} \quad \text{(Equation 8-2)}$$

$$V'_{STEP1} = \alpha_{sig3} \alpha_{temp3} V_{STEP1} + \beta_{sig3} + \beta_{temp3} \quad \text{(Equation 8-3)}$$

$$V'_{STEP2} = \alpha_{sig4} \alpha_{temp4} V_{STEP2} + \beta_{sig4} + \beta_{temp4} \quad \text{(Equation 8-4)}$$

In equation 8-1 to equation 8-4, coefficients $\alpha_{sig1}$, $\alpha_{sig2}$, $\alpha_{sig3}$, $\alpha_{sig4}$, $\beta_{sig1}$, $\beta_{sig2}$, $\beta_{sig3}$, and $\beta_{sig4}$ are determined from transmission signal information. Further, coefficients $\alpha_{temp1}$, $\alpha_{temp2}$, $\alpha_{temp3}$, $\alpha_{temp4}$, $\beta_{temp1}$, $\beta_{temp2}$, $\beta_{temp3}$, and $\beta_{temp4}$ are determined from temperature information.

Offset calculation section 521 corrects threshold values $V_{th1}$ and $V_{th2}$ or change step amounts $V_{STEP1}$ and $V_{STEP2}$ based on at least one of transmission signal information indicating the transmission band of a transmission signal and temperature information, to obtain threshold values $V'_{th1}$ and $V'_{th2}$ or change step amounts $V'_{STEP1}$ and $V'_{STEP2}$.

Offset calculation section 521 sets offset voltage using corrected candidates of change step amount $V'_{STEP1}$ and $V'_{STEP2}$ that are associated with the result of comparison between target amount of correction $\Delta V(t)$ and a plurality of threshold values $V'_{th1}$ and $V'_{th2}$ after correction, as change step amount $\Delta V_{OFST}(t)$.

Because offset calculation section 521 does not need to include a plurality of LUTs per transmission band and per temperature characteristics, it is possible to suppress increase in memory capacity.

As described above, according to the present embodiment, temperature detector 510 measures temperature around power amplifier 130 and outputs the measured temperature as temperature information, and offset control section 520 sets offset voltage, based on transmission signal information indicating the transmission band of a transmission signal and temperature information in addition to a subtracted signal. For example, offset calculation section 521 includes a LUT in which different candidates of change step amount are associated with target amount of correction $\Delta V(t)$, as change step amount $\Delta V_{OFST}(t)$, according to the result of comparison between target amount of correction $\Delta V(t)$ and a plurality of threshold values, in a predetermined band and at predetermined temperature. Offset calculation section 521 corrects a plurality of threshold values and candidates of the change step amount based on at least either one of transmission signal information indicating the transmission band of a transmission signal and temperature information. Offset calculation section 521 sets offset voltage using the corrected change step amount that is associated with the result of comparison between target amount of correction $\Delta V(t)$ and a plurality of threshold values after correction.

By this means, even in the case where the transmission band of a transmission signal or temperature of power amplifier 130 varies, the optimal offset voltage including temperature compensation is supplied to adder 170, so that deterioration of characteristics caused by variation of the relationship between power supply voltage and output power of power amplifier 130 is compensated. For this reason, transmission circuit 500 can operate efficiently.

Embodiment 6

Figure 13:
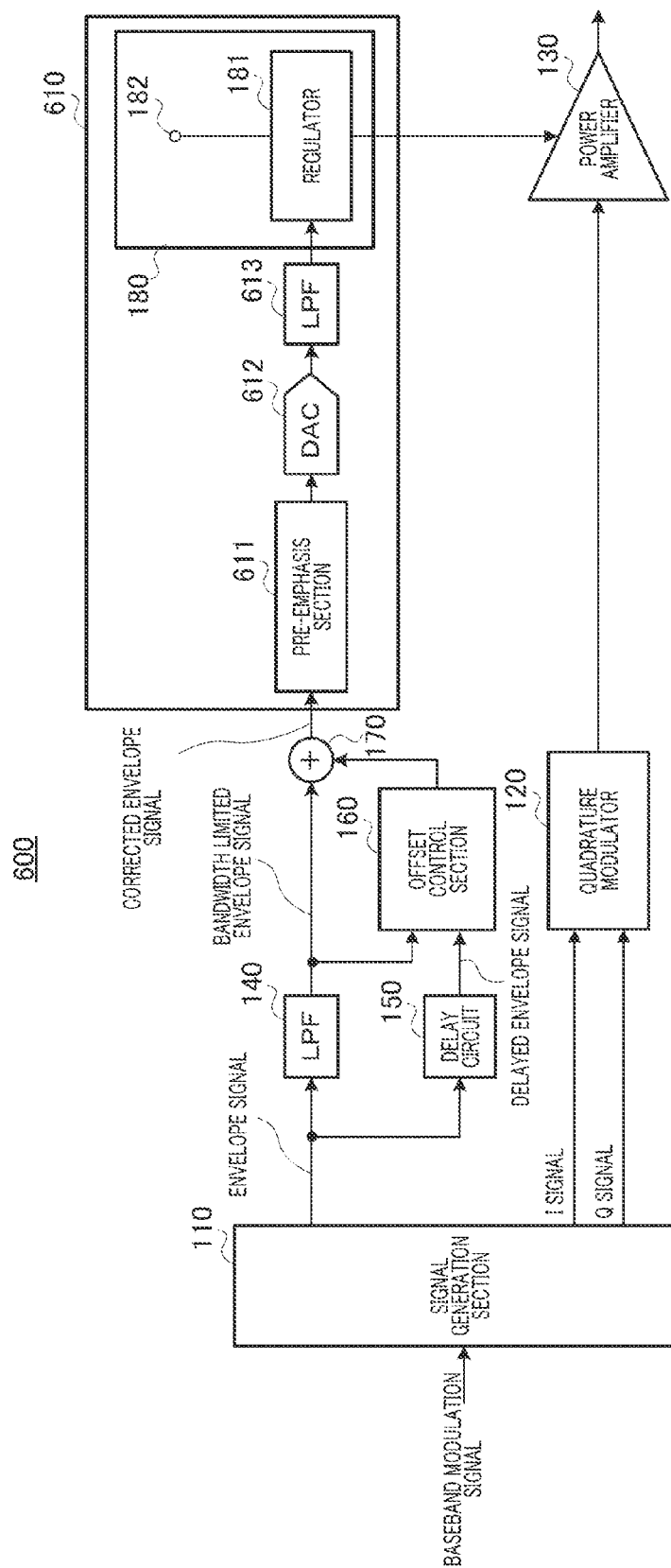
FIG. 13 is a block diagram showing a principal-part configuration of a transmission circuit according to Embodiment 6 of the present invention.

FIG. 13 is a block diagram showing a principal-part configuration of a transmission circuit according to the present embodiment. In the transmission circuit of FIG. 13 according to the present embodiment, components that are the same as in FIG. 2 will be assigned the same reference numerals as in FIG. 2 and overlapping explanations will be omitted. Compared to transmission circuit 100 of FIG. 2, transmission circuit 600 of FIG. 13 includes power supply voltage control section 610 instead of power supply voltage control section 180.

Power supply voltage control section 610 includes pre-emphasis section 611, DAC 612, and LPF 613.

Pre-emphasis section 611 pre-emphasizes (increases in advance the level of) a corrected envelope signal supplied from adder 170, and supplies the corrected envelope signal after pre-emphasis to DAC 612.

DAC 612 converts the corrected envelope signal in the digital domain that is processed by pre-emphasis section 611 into a corrected envelope signal in the analogue domain, and outputs the analogue-domain corrected envelope signal after conversion to LPF 613.

LPF 613 performs bandwidth limitation on an output signal of DAC 612 to remove an unnecessary harmonics component.

Figure 14A:
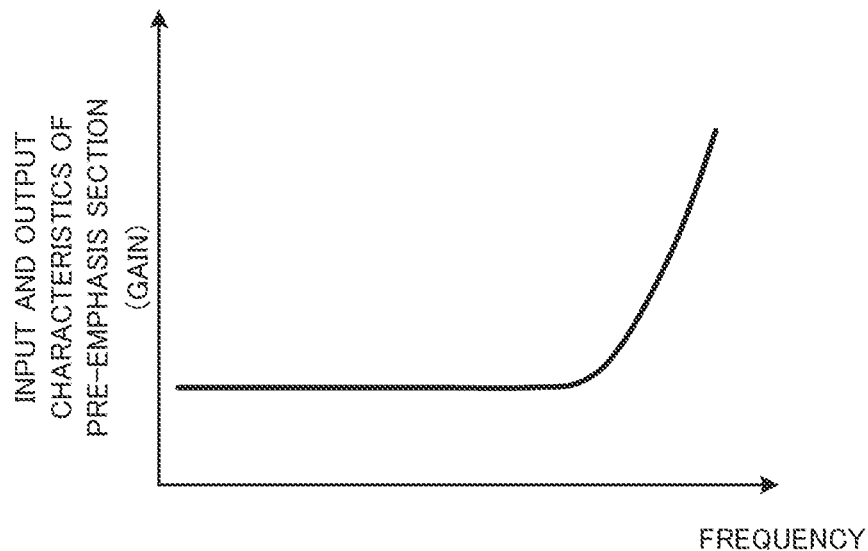
FIG. 14A-14B shows an example of gain characteristics of a pre-emphasis section.
Figure 14B:
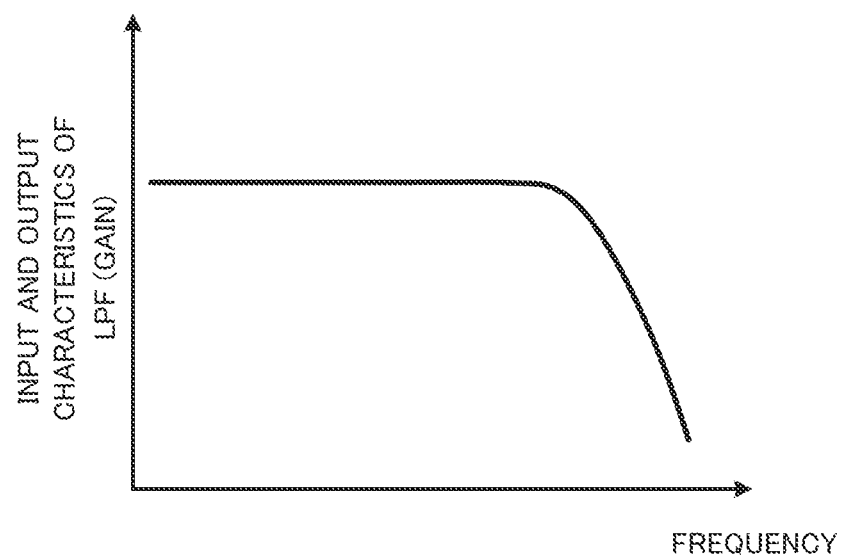

FIG. 14 shows frequency characteristics of pre-emphasis section 611 and LPF 613. As shown in FIG. 14A, inverse characteristics of frequency characteristics of LPF 613 (see FIG. 14B) is set for frequency characteristics of pre-emphasis section 611. By this means, it is possible to increase in advance (pre-emphasize) the level in the former stage of pre-emphasis section 611, according to decrease of the corrected envelope signal level in the later stage of LPF 613, making it possible to compensate deterioration of a signal in LPF 613.

As described above, according to the present embodiment, in power supply voltage control section 610, DAC 612 performs digital-to-analog conversion on the digital-domain corrected envelope signal that received pre-emphasis processing in pre-emphasis section 611, and LPF 613 performs bandwidth limitation on the digital-domain corrected envelope signal to remove an unnecessary harmonics component. Pre-emphasis section 611 increases the corrected envelope signal level (performs pre-emphasis), based on the inverse characteristics of input and output characteristics of LPF 613.

Because it is possible to increase the level in advance (perform pre-emphasis) in pre-emphasis section 611, according to decrease of the corrected envelope signal level in LPF 613, it is possible to compensate deterioration of a signal in LPF 613.

Embodiment 7

Figure 15:
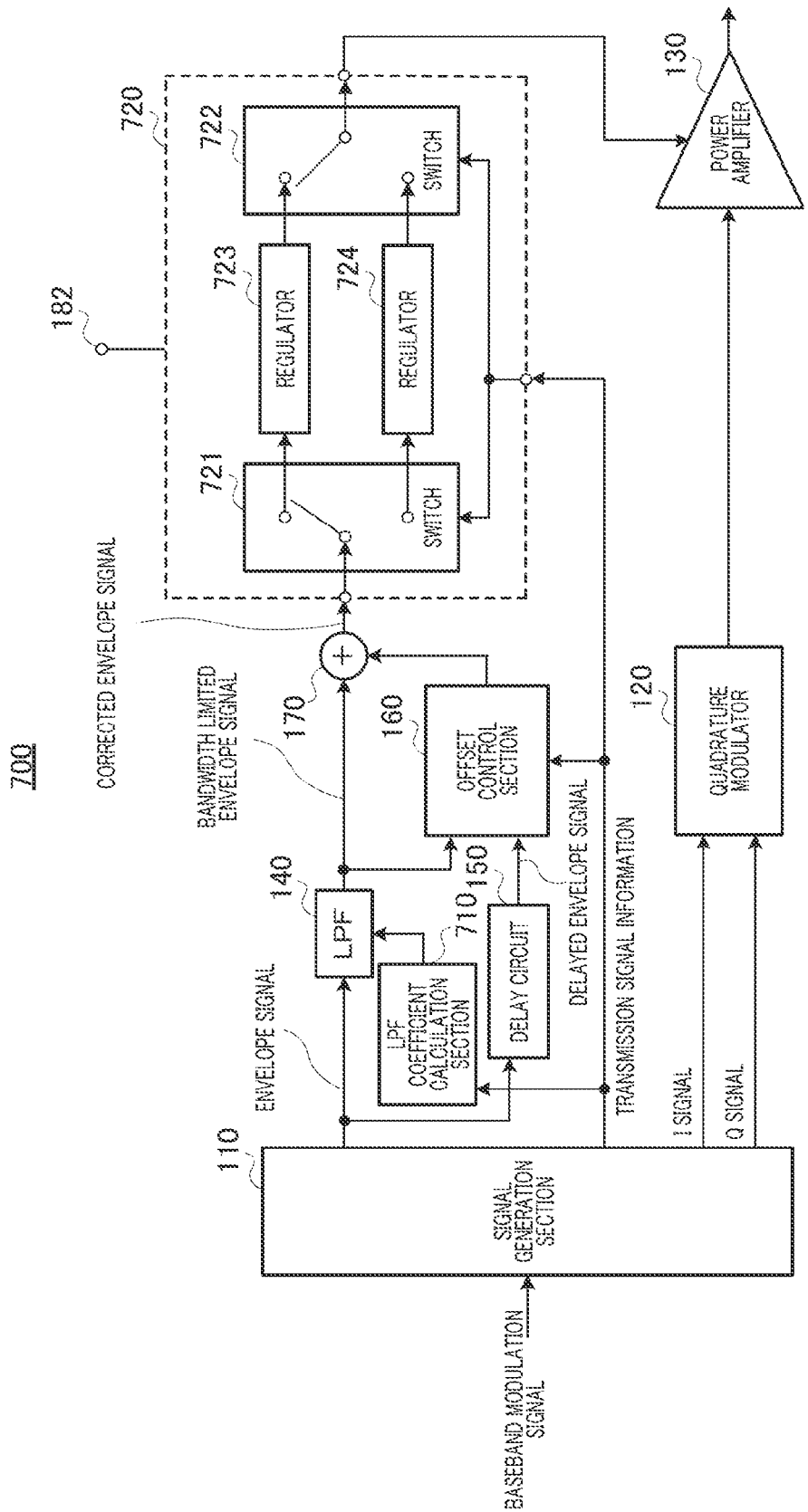
FIG. 15 is a block diagram showing a principal-part configuration of a transmission circuit according to Embodiment 7 of the present invention.

FIG. 15 is a block diagram showing a principal-part configuration of the transmission circuit according to the present embodiment. In the transmission circuit of FIG. 15 according to the present embodiment, components that are the same as in FIG. 2 will be assigned the same reference numerals as in FIG. 2 and overlapping explanations will be omitted. Compared to transmission circuit 100 of FIG. 2, transmission circuit 700 of FIG. 15 includes power supply voltage control section 720 instead of power supply voltage control section 180 and adds LPF coefficient calculation section 710.

LPF coefficient calculation section 710 determines the pass band of LPF 140 based on the transmission band of a transmission signal that is indicated by transmission signal information, and calculates a filter coefficient according to the determined pass band. LPF coefficient calculation section 710 supplies the calculated filter coefficient to LPF 140.

Specifically, LPF coefficient calculation section 710 compares the transmission band with a predetermined threshold value maintained inside. According to the comparison result, LPF coefficient calculation section 710 outputs to LPF 140 either one of the first coefficient that associates the bandwidth of LPF 140 with the bandwidth of first regulator 723 or the second coefficient that associates the bandwidth of LPF 140 with the bandwidth of second regulator 724.

By this means, the width of bandwidth limitation (pass band) of LPF 140 is changed by the supplied filter coefficient, and is set as the pass band corresponding to either one of first regulator 723 or second regulator 724. It is preferable that the bandwidth of LPF 140 in the case where the first coefficient is supplied be set equal to or narrower than the bandwidth of first regulator 723, and the bandwidth of LPF 140 in the case where the second coefficient is supplied be set equal to or narrower than the bandwidth of second regulator 724.

Power supply voltage control section 720 includes first switch 721, second switch 722, first regulator 723, and second regulator 724.

First switch 721 switches output of a corrected envelope signal to either of first regulator 723 or second regulator 724, based on the transmission band of a transmission signal that is indicated by transmission signal information.

Second switch 722 switches input to either of first regulator 723 or second regulator 724, based on the transmission band of a transmission signal that is indicated by transmission signal information.

First regulator 723 and second regulator 724, which includes the same configuration as regulator 181, transforms the direct current voltage supplied from power supply terminal 182 to voltage corresponding to the input signal, and supplies the transformed voltage to power amplifier 130. However, first regulator 723 and second regulator 724 support different bandwidths. A case will be described below where second regulator 724 supports the wider band and is a lower-efficient regulator, compared to first regulator 723.

An operation of transmission circuit 700 configured as described above will be described below.

LPF coefficient calculation section 710 compares the transmission band of a transmission signal that is indicated by transmission signal information with a predetermined threshold value maintained inside. When the value of the transmission bandwidth of the transmission signal is equal to or smaller than the threshold value, LPF coefficient calculation section 710 supplies to LPF 140 the first coefficient corresponding to the bandwidth of first regulator 723. On the other hand, when the value of the transmission bandwidth of the transmission signal is greater than the predetermined threshold value, LPF coefficient calculation section 710 supplies to LPF 140 the second coefficient corresponding to the bandwidth of second regulator 724.

Likewise, first switch 721 and second switch 722 also compare the transmission band of a transmission signal that is indicated by transmission signal information with a predetermined threshold value maintained inside. When the value of the transmission bandwidth of the transmission signal is equal to or smaller than the threshold value, first switch 721 and second switch 722 select first regulator 723, which supports a narrower band and is more efficient compared to second regulator 724. On the other hand, when the value of the transmission bandwidth of the transmission signal is greater than the threshold value, first switch 721 and second switch 722 select second regulator 724, which supports a wider band and is less efficient compared to first regulator 723.

As described above, according to the present embodiment, LPF coefficient calculation section 710 determines a filter coefficient of LPF 140 based on information indicating the transmission band of a transmission signal, and LPF 140 performs band limitation on an envelope signal using the filter coefficient determined by LPF coefficient calculation section 710. Further, power supply voltage control section 720 is configured so that first regulator 723 outputs the voltage corresponding to a corrected envelope signal and second regulator 724, which is a regulator that supports the different bandwidth from the bandwidth supported by first regulator 723, outputs the voltage corresponding to the corrected envelope signal. Switch 721 switches output of the corrected envelope signal to either of first regulator 723 or second regulator 724, based on transmission information indicating the transmission band of the transmission signal.

Further, LPF coefficient calculation section 710 supplies to LPF 140 either one of a coefficient that sets the bandwidth of LPF 140 equal to or narrower than the bandwidth of first regulator 723, as the first coefficient corresponding to first regulator 723, or a coefficient that sets the bandwidth of LPF 140 equal to or narrower than the bandwidth of second regulator 724, as the second coefficient corresponding to second regulator 724.

Further, first regulator 723 supports the narrower bandwidth and is more highly efficient compared to second regulator 724, and first switch 721 compares the transmission bandwidth and a predetermined threshold value, and selects first regulator 723 when the value of the transmission bandwidth of the transmission signal is smaller than the predetermined threshold value, and selects second regulator 724 when the value of the transmission bandwidth of the transmission signal is the predetermined threshold value or greater.

By this means, like the system of 3rd Generation Partnership Project Radio Access Network Long Term Evolution (3 GPP LTE), even when the transmission band of a transmission signal varies dynamically, it is possible to set the pass bands of LPF 140 and power supply voltage control section 720 according to the transmission band, so that it is possible to maintain the efficiency of power amplifier 130 and increase the efficiency of power supply voltage control section 720, at the same time.

Although a case has been described with the above embodiment where power supply voltage control section 720 has two regulators that support different bandwidths, power supply voltage control section 720 can have N regulators (N is an integer of 3 or greater). When power supply voltage control section 720 has N regulators (N is an integer of 3 or greater), LPF coefficient calculation section 710 can switch N filter coefficients corresponding to the bandwidths supported by the N regulators and output the filter coefficient to LPF 140.

The disclosure of Japanese Patent Application No. 2010-121664, filed on May 27, 2010, including the specification, drawings and abstract, is incorporated herein by reference in its entirety.

INDUSTRIAL APPLICABILITY

The present invention is useful as a transmission circuit for overall communication apparatuses including mobile phones or wireless LANs.

| Reference Signs List | |
|---|---|
| 100, 200, 300, 400, 500, 600, 700 | Transmission circuit |
| 110 | Signal generation section |
| 120 | Quadrature modulator |
| 130 | Power amplifier |
| 140, 613 | LPF |
| 150 | Delay circuit |
| 160, 210, 310, 410, 520 | Offset control section |
| 170 | Adder |
| 180, 610, 720 | Power supply voltage control section |
| 181, 181a, 181b, 181c, 723, 724 | Regulator |
| 1811 | Switching regulator |
| 1812 | Series regulator |
| 182 | Power supply terminal |
| 211, 311 | Subtractor |
| 212, 413, 521 | Offset calculation section |
| 312 | Maximum value calculation section |
| 411 | Comparator |
| 412 | Averaging circuit |
| 510 | Temperature detector |
| 611 | Pre-emphasis section |
| 612 | DAC |
| 710 | LPF coefficient calculation section |
| 721, 722 | Switch |

The invention claimed is:

1. A transmission circuit comprising:
a quadrature modulator that generates a vector modulation wave by quadrature-modulating an I signal, the I signal being an in-phase component of a modulation signal, and a Q signal, the Q signal being a quadrature-phase component of the modulation signal;
a power amplifier that generates a transmission signal by amplifying the vector modulation wave according to power supply voltage;
a low pass filter that generates a bandwidth limited envelope signal by performing bandwidth limitation on an envelope signal, the envelope signal being envelope information of the modulation signal;
a delay section that generates a delayed envelope signal by delaying the envelope signal for a time corresponding to an amount of delay of the low pass filter;
an offset control section that sets offset voltage based on the bandwidth limited envelope signal and the delayed envelope signal;
an addition section that corrects the bandwidth limited envelope signal by adding the offset voltage to the bandwidth limited envelope signal, to generate a corrected envelope signal; and
a power supply voltage control section that supplies voltage corresponding to the corrected envelope signal, as the power supply voltage, to the power amplifier;
wherein the offset voltage is voltage that makes a level of the corrected envelope signal equal to or higher than a level of the delayed envelope signal.

2. The transmission circuit according to claim 1, wherein:
the offset control section comprises:
a subtraction section that generates a subtracted signal by subtracting the level of the delayed envelope signal from the level of the bandwidth limited envelope signal; and
an offset calculation section that determines a change step amount of the offset voltage from a plurality of candidates of the change step amount based on the subtracted signal, and sets the offset voltage using the determined change step amount.

3. The transmission circuit according to claim 2, wherein:
the offset calculation section:
includes a table in which target amount of correction $\Delta V(t)$ that is determined according to the subtracted signal is associated with change step amount of the offset voltage $\Delta V_{OFST}(t)$, and
sets the offset voltage using the change step amount $\Delta V_{OFST}(t)$ that is associated with the target amount of correction $\Delta V(t)$.

4. The transmission circuit according to claim 3, wherein, in the table, a different candidate of the change step amount is associated with the target amount of correction $\Delta V(t)$, as the change step amount $\Delta V_{OFST}(t)$, according to a result of comparison between the target amount of correction $\Delta V(t)$ and a plurality of threshold values.

5. The transmission circuit according to claim 1, wherein:
the offset control section comprises:
a subtraction section that outputs a result obtained by subtracting the level of the bandwidth limited envelope signal from the level of the delayed envelope signal; and
a maximum value subtraction section that sets the offset voltage by calculating a maximum value in a certain period of an output signal of the subtraction section.

6. The transmission circuit according to claim 2, wherein:
the subtraction section comprises:
a comparison section that compares the level of the bandwidth limited envelope signal output from the low pass filter with the level of the delayed envelope signal output from the delay section, and outputs a result of the comparison; and
an averaging section that generates the subtracted signal by averaging an output signal of the comparison section.

7. The transmission circuit according to claim 1, further comprising a temperature detection section that generates temperature information by detecting temperature of the power amplifier;
wherein the offset control section sets the offset voltage based on transmission signal information indicating a transmission band of the transmission signal and the temperature information in addition to a subtracted signal.

8. The transmission circuit according to claim 7, wherein:
an offset calculation section:
includes a table in which a different candidate of a change step amount is associated with target amount of correction $\Delta V(t)$, as change step amount $\Delta V_{OFST}(t)$, according to a result of comparison between the target amount of correction $\Delta V(t)$ and a plurality of threshold values, in a predetermined band and at a predetermined temperature;
corrects the plurality of threshold values and the candidate of the change step amount, based on any one of transmission signal information indicating at least one of the transmission band of a transmission signal, transmission power, and a modulation scheme, and the temperature information; and
sets the offset voltage using the candidate of the change step amount after correction that is associated with the result of the comparison between the target amount of correction $\Delta V(t)$ and the plurality of threshold values.

9. The transmission circuit according to claim 1, wherein:
the power supply voltage control section comprises:
a pre-emphasis section that increases the level of the corrected envelope signal in advance;

a conversion section that performs digital-to-analog conversion on an output signal of the pre-emphasis section; and a filter that performs bandwidth limitation on an output signal of the conversion section and removes an unnecessary harmonics component;

wherein the pre-emphasis section pre-emphasizes the corrected envelope signal, based on inverse characteristics of input and output characteristics of the filter.

10. The transmission circuit according to claim 1, further comprising a coefficient calculation section that determines a filter coefficient of the low pass filter, based on information indicating a transmission band of the transmission signal, wherein:

the power supply voltage control section comprises:

a first regulator that outputs voltage corresponding to the corrected envelope signal;

a second regulator that supports a different bandwidth from a bandwidth supported by the first regulator, and outputs voltage corresponding to the corrected envelope signal; and a switch section that switches output of the corrected envelope signal to any one of the first regulator or the second regulator, based on the transmission information indicating the transmission band of the transmission signal;

wherein the low pass filter performs bandwidth limitation on the envelope signal using the filter coefficient.

11. The transmission circuit according to claim 10, wherein the coefficient calculation section compares a width of the transmission band with a predetermined threshold value, and, based on the result of the comparison, supplies to the low pass filter any one of a first coefficient that sets a bandwidth of the low pass filter equal to or narrower than the bandwidth of the first regulator, or a second coefficient that sets the bandwidth of the low pass filter equal to or narrower than the bandwidth of the second regulator.

12. The transmission circuit according to claim 10, wherein:

the first regulator supports a narrower bandwidth and is more highly efficient compared to the second regulator; and the switch section compares a width of the transmission band and a predetermined threshold, and selects the first regulator when a value of the width of the transmission band of the transmission signal is smaller than the predetermined threshold value, and selects the second regulator when a value of the width of the transmission band of the transmission signal is greater than the predetermined threshold value.

13. A communication apparatus comprising the transmission circuit according to claim 1.

14. A transmission method in a transmission circuit that comprises a quadrature modulator that generates a vector modulation wave by quadrature-modulating an I signal, the I signal being an in-phase component of a modulation signal, and a Q signal, the Q signal being a quadrature-phase component of the modulation signal, and a power amplifier that generates a transmission signal by amplifying the vector modulation wave according to power supply voltage, the transmission method comprising the steps of:

generating a bandwidth limited envelope signal by performing bandwidth limitation on an envelope signal, the envelope signal being envelope information of the modulation signal;

generating a delayed envelope signal by delaying the envelope signal for a time corresponding to an amount of delay in the bandwidth limitation;

setting offset voltage based on the bandwidth limited envelope signal and the delayed envelope signal;

correcting the bandwidth limited envelope signal by adding the offset voltage to the bandwidth limited envelope signal, to generate a corrected envelope signal; and supplying voltage corresponding to the corrected envelope signal, as the power supply voltage, to the power amplifier;

wherein the offset voltage is voltage that makes a level of the corrected envelope signal equal to or higher than a level of the delayed envelope signal.

* * * * *